United States Patent
Park et al.

(10) Patent No.: US 9,634,012 B2
(45) Date of Patent: Apr. 25, 2017

(54) METHOD OF FORMING ACTIVE PATTERNS, ACTIVE PATTERN ARRAY, AND METHOD OF MANUFACTURING A SEMICONDUCTOR DEVICE

(71) Applicant: Samsung Electronics Co., Ltd., Suwon-si (KR)

(72) Inventors: Tae-Jin Park, Yongin-si (KR); Chan-sic Yoon, Anyang-si (KR); Ki-Seok Lee, Busan (KR); Hyeon-Ok Jung, Daejeon (KR); Dae-Ik Kim, Hwaseong-si (KR); Bong-Soo Kim, Yongin-si (KR); Yong-Kwan Kim, Yongin-si (KR); Eun-Jung Kim, Daegu (KR); Se-Myeong Jang, Gunpo-si (KR); Min-su Choi, Incheon (KR); Sung-Hee Han, Hwaseong-si (KR); Yoo-Sang Hwang, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 15/015,651

(22) Filed: Feb. 4, 2016

(65) Prior Publication Data
US 2017/0025420 A1  Jan. 26, 2017

(30) Foreign Application Priority Data

Jul. 20, 2015  (KR) .......................... 10-2015-0102208

(51) Int. Cl.
 *H01L 21/311* (2006.01)
 *H01L 27/108* (2006.01)
 *H01L 21/308* (2006.01)

(52) U.S. Cl.
 CPC .... *H01L 27/10894* (2013.01); *H01L 21/3086* (2013.01); *H01L 27/10852* (2013.01); *H01L 27/10876* (2013.01); *H01L 27/10885* (2013.01)

(58) Field of Classification Search
None
See application file for complete search history.

(56) References Cited

U.S. PATENT DOCUMENTS

| 7,001,712 B2 | 2/2006 | Imai et al. |
| 7,539,970 B2 | 5/2009 | Jung et al. |

(Continued)

FOREIGN PATENT DOCUMENTS

| KR | 0451498 | 12/2004 |
| KR | 1020130004673 | 1/2013 |

*Primary Examiner* — Sonya D McCall Shepard
(74) *Attorney, Agent, or Firm* — Onello & Mello, LLP

(57) ABSTRACT

In a method of forming active patterns, first patterns are formed in a first direction on a cell region of a substrate, and a second pattern is formed on a peripheral circuit region of the substrate. The first pattern extends in a third direction crossing the first direction. First masks are formed in the first direction on the first patterns, and a second mask is formed on the second pattern. The first mask extends in a fourth direction crossing the third direction. Third masks are formed between the first masks extending in the fourth direction. The first and second patterns are etched using the first to third masks to form third and fourth patterns. Upper portions of the substrate are etched using the third and fourth patterns to form first and second active patterns in the cell and peripheral circuit regions.

20 Claims, 42 Drawing Sheets

(56) References Cited

U.S. PATENT DOCUMENTS

| | | |
|---|---|---|
| 7,563,712 B2 | 7/2009 | Jung |
| 7,902,074 B2 | 3/2011 | Niroomand et al. |
| 8,008,163 B2 | 8/2011 | Jang et al. |
| 8,143,163 B2 | 3/2012 | Choi |
| 8,426,314 B2 | 4/2013 | Kim |
| 8,465,908 B2 | 6/2013 | Choi |
| 8,728,909 B2 | 5/2014 | Kim |
| 8,785,328 B2 | 7/2014 | Sun et al. |
| 8,835,321 B2 | 9/2014 | Ha |
| 2012/0171867 A1* | 7/2012 | Kim .................. H01L 21/3086 438/702 |
| 2012/0225546 A1 | 9/2012 | Kamiya |
| 2013/0009226 A1 | 1/2013 | Park et al. |
| 2014/0264727 A1* | 9/2014 | Kim .................. H01L 21/76224 257/516 |
| 2015/0333059 A1* | 11/2015 | Lee .................. H01L 27/1052 257/334 |

* cited by examiner

METHOD OF FORMING ACTIVE PATTERNS, ACTIVE PATTERN ARRAY, AND METHOD OF MANUFACTURING A SEMICONDUCTOR DEVICE

CROSS-REFERENCE TO RELATED APPLICATION

This U.S. non-provisional application claims priority under 35 USC §119 to Korean Patent Application No. 10-2015-0102208, filed on Jul. 20, 2015 in the Korean Intellectual Property Office (KIPO), the contents of which are herein incorporated by reference in their entirety.

BACKGROUND

1. Field

Some example embodiments of the present inventive concepts relate to a method of forming active patterns, an active array, and a method of manufacturing a semiconductor device.

2. Description of the Related Art

When a dynamic random access memory (DRAM) device is manufactured, a preliminary active pattern may be formed to have a linear shape, and the preliminary active pattern may be cut to form a plurality of active patterns. The preliminary active pattern may be cut by a contact hole-type trimming process. However, in using a contact hole-type trimming process, a space between the active patterns may not be uniform.

SUMMARY

Some example embodiments provide a method of forming active patterns having good characteristics.

Some example embodiments provide an active pattern array having good characteristics.

Example embodiments provide a method of manufacturing a semiconductor device using the method of forming the active patterns having good characteristics.

According to an aspect of the present inventive concepts, there is provided a method of forming active patterns. In the method, a plurality of first patterns may be formed in a first direction on a cell region of a substrate, and a second pattern may be formed on a peripheral circuit region of the substrate. Each of the first patterns may extend in a third direction crossing the first direction. A plurality of first masks may be formed in the first direction on the first patterns, and a second mask may be formed on the second pattern. Each of the first masks may extend in a fourth direction crossing the third direction. A plurality of third masks may be formed between the first masks. Each of the third masks may extend in the fourth direction. The first patterns may be etched using the first and third masks as an etching mask and the second pattern may be etched using the second mask to form third and fourth patterns, respectively. Upper portions of the substrate may be etched using the third and fourth patterns as an etching mask to form first and second active patterns in the cell region and the peripheral circuit region, respectively.

In some example embodiments, before the first and second masks are formed, an intermediate layer covering the first and second patterns may be further formed. The first and second masks may be formed on the intermediate layer.

In some example embodiments, when the plurality of third masks are formed between the first masks, a spacer layer may be formed on the intermediate layer to cover the first masks. A third mask layer may be formed on the intermediate layer. An upper portion of the third mask layer may be planarized to form the plurality of third masks.

In some example embodiments, the spacer layer may be formed to cover the second mask. After the third mask layer is formed, a fourth mask may be formed on the third mask layer on a portion of the cell region. The third mask layer may be etched using the fourth mask as an etching mask to remove a portion of the third mask layer on the peripheral circuit region of the substrate.

In some example embodiments, when the third mask layer is etched using the fourth mask as an etching mask, a third mask layer pattern partially covering the cell region may be formed. The third masks may be formed by planarizing an upper portion of the third mask layer pattern.

In some example embodiments, the fourth mask may have a rectangular shape in a plan view.

In some example embodiments, the fourth mask may overlap a central portion of each of the first masks, and ends of each of the first masks extend beyond the fourth mask in the fourth direction.

In some example embodiments, a length of each of the third masks in the fourth direction may be less than a length of each of the first masks in the fourth direction.

In some example embodiments, before the fourth mask is formed on the third mask layer, a protection layer may be formed on the third mask layer. The protection layer may be etched using the fourth mask as an etching mask to form a protection pattern exposing a portion of the third mask layer on the peripheral circuit region of the substrate.

In some example embodiments, the first and third masks may be spaced apart from each other in the first direction by a constant distance.

In some example embodiments, when the first and second patterns are formed in the cell region and the peripheral circuit region, respectively, of the substrate, a layer structure may be formed on the substrate. A plurality of openings may be formed in the first direction through the layer structure in the cell region to expose top surfaces of the substrate, respectively. Each of the openings may extend in the third direction.

In some example embodiments, the first, third and fourth directions may have acute angles with one another.

In some example embodiments, the second mask may extend in a second direction substantially perpendicular to the first direction.

In some example embodiments, a whole contour of the first patterns may be a first rectangular shape, and a whole contour of the first active patterns may be a second rectangular shape smaller than and within the first rectangular shape in a plan view. A portion of the contour of the first active patterns may protrude from the second rectangular shape.

According to another aspect of the present inventive concepts, there is provided an active pattern array. The active pattern array may include a plurality of active pattern columns spaced apart from each other in a first direction by a second distance. Each of the active pattern columns may include a plurality of active patterns space apart from each other in a third direction crossing the first direction by a first distance. A whole contour of the active patterns may be a rectangular shape, however, may have protrusions protruding from at least one side of the rectangular shape.

In some example embodiments, each of the active patterns may have a shape of parallelogram including two sides parallel with the third direction and two sides parallel with a fourth direction. The fourth direction may have an acute angle with the third direction.

In some example embodiments, the protrusions may be point symmetrical with each other with respect to a center of the rectangular shape.

According to another aspect of the present inventive concepts, there is provided a method of forming a semiconductor device. In the method, a plurality of first patterns may be formed in a first direction on a cell region of a substrate and a second pattern on a peripheral circuit region of the substrate. Each of the first patterns may extend in a third direction crossing the first direction. A plurality of first masks may be formed in the first direction on the first patterns and a second mask on the second pattern. Each of the first masks may extend in a fourth direction crossing the third direction. A plurality of third masks may be formed between the first masks. Each of the third masks may extend in the fourth direction. The first patterns may be etched using the first and third masks as an etching mask and second patterns using the second mask to form third and fourth patterns, respectively. Upper portions of the substrate may be etched using the third and fourth patterns as an etching mask to form first and second active patterns in the cell region and the peripheral circuit region, respectively. A first gate structure may be formed through the first active patterns. First and second impurity regions may be formed at upper portions of the first active patterns adjacent the first gate structure. A bit line electrically connected to the first impurity region may be formed. A capacitor electrically connected to the second impurity region may be formed.

In some example embodiments, a second gate structure may be further formed on the second active pattern.

In some example embodiments, a length of each of the third masks in the fourth direction may be less than a length of each of the first masks in the fourth direction.

According to another aspect of the present inventive concepts, a method of forming active patterns includes forming a plurality of first patterns in a first direction on a cell region of a substrate and a second pattern on a peripheral circuit region of the substrate. Each of the first patterns extends in a third direction crossing the first direction. The method further includes forming a plurality of first masks in the first direction on the first patterns and a second mask on the second pattern. Each of the first masks extends in a fourth direction crossing the third direction. The method further includes etching the first patterns using the first masks as an etching mask and the second pattern using the second mask as an etching mask to form third and fourth patterns, respectively, and etching upper portions of the substrate using the third and fourth patterns as an etching mask to form first and second active patterns in the cell region and the peripheral circuit region, respectively. The first active patterns are spaced apart from each other by a constant distance in the third direction and define a first active pattern column and the first active pattern columns are spaced apart from each other by a constant distance in the first direction.

In some embodiments, forming the plurality of first masks further comprises forming a plurality of third masks between the first masks, each of the third masks extending in the fourth direction. Etching the first patterns includes using the first and third masks as an etching mask.

In some embodiments, the first and third masks are spaced apart from each other in the first direction by a constant distance.

In some embodiments, the first, third and fourth directions have acute angles with one another.

In some embodiments, the second mask extends in a second direction substantially perpendicular to the first direction In accordance with another aspect of the present inventive concepts, the first and second active regions may be formed in the cell region and the peripheral circuit region, respectively, by the same process. The first active patterns in the first active region may be formed to be spaced apart from each other by a constant distance.

BRIEF DESCRIPTION OF THE DRAWINGS

The foregoing and other features and advantages of the inventive concepts will be apparent from the more particular description of preferred embodiments of the inventive concepts, as illustrated in the accompanying drawings in which like reference characters refer to the same parts throughout the different views. The drawings are not necessarily to scale, emphasis instead being placed upon illustrating the principles of the inventive concepts.

DESCRIPTION OF EMBODIMENTS

Figure 1:
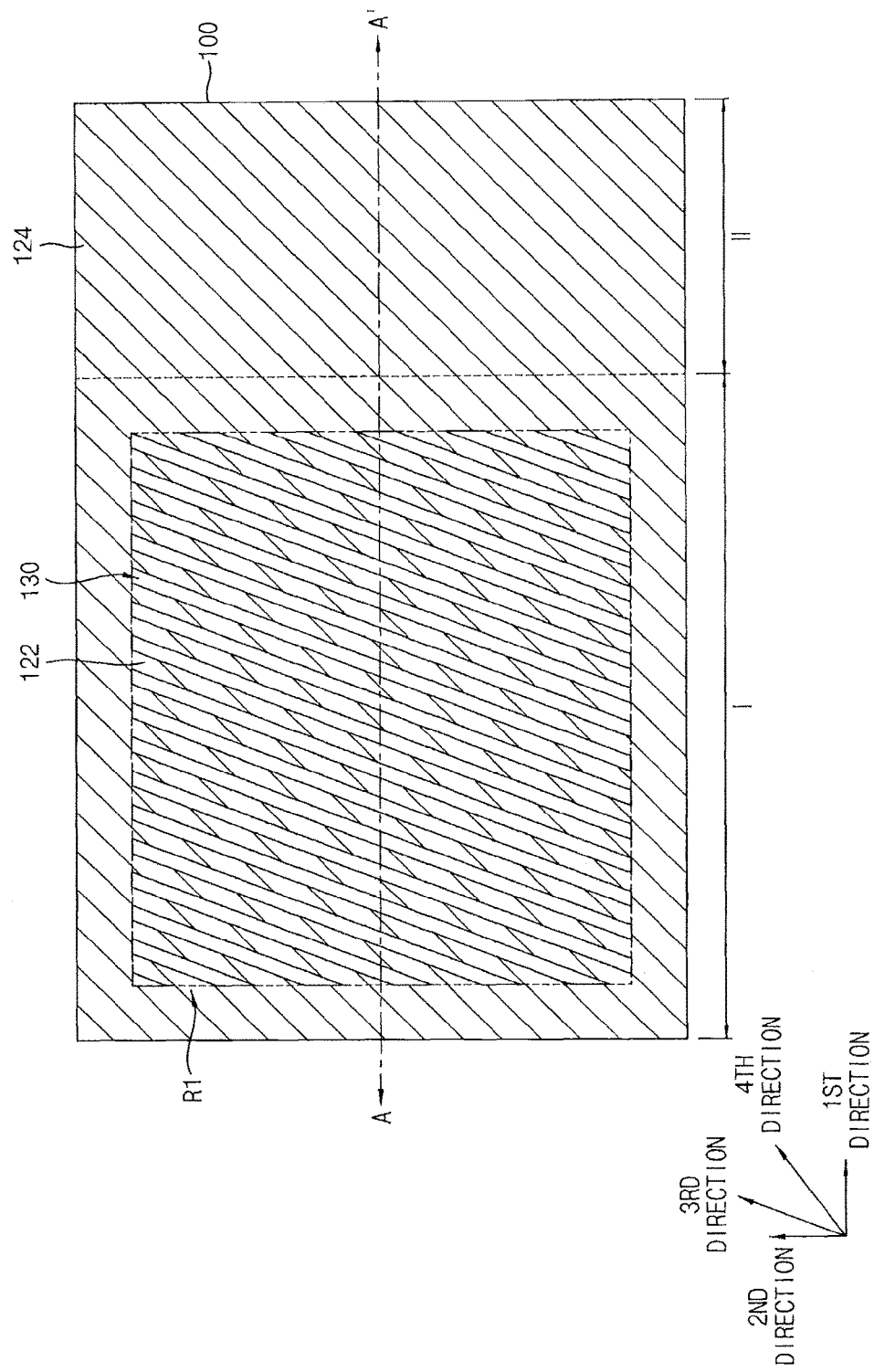
FIGS. 1, 3, 7, 14, 18, 21 and 23 are plan views

Various example embodiments will be described more fully with reference to the accompanying drawings, in which some example embodiments are shown. The present inventive concepts may, however, be embodied in many different forms and should not be construed as limited to the example embodiments set forth herein.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. As used herein, the term "and/or" includes any and all combinations of one or more of the associated listed items.

It will be understood that, although the terms first, second, third, fourth etc. may be used herein to describe various elements, components, regions, layers and/or sections, these elements, components, regions, layers and/or sections should not be limited by these terms. These terms are only used to distinguish one element, component, region, layer and/or section from another element, component, region, layer and/or section. For example, a first element, component, region, layer and/or section could be termed a second element, component, region, layer and/or section without departing from the teachings of the present inventive concepts.

Spatially relative terms, such as "beneath," "below," "lower," "above," "upper" and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the present inventive concepts. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present inventive concept.

Although corresponding plan views and/or perspective views of some cross-sectional view(s) may not be shown, the cross-sectional view(s) of device structures illustrated herein provide support for a plurality of device structures that extend along two different directions as would be illustrated in a plan view, and/or in three different directions as would be illustrated in a perspective view. The two different directions may or may not be orthogonal to each other. The three different directions may include a third direction that may be orthogonal to the two different directions. The plurality of device structures may be integrated in a same electronic device. For example, when a device structure (e.g., a memory cell structure or a transistor structure) is illustrated in a cross-sectional view, an electronic device may include a plurality of the device structures (e.g., memory cell structures or transistor structures), as would be illustrated by a plan view of the electronic device. The plurality of device structures may be arranged in an array and/or in a two-dimensional pattern.

FIGS. 1, 3, 7, 14, 18, 21 and 23 are plan views and FIGS. 2, 4-6, 8-13, 15-17, 19-20 and 22 are cross-sectional views illustrating stages of a method of forming active patterns in accordance with example embodiments. The cross-sectional views may be taken along lines A-A' of corresponding plan views, respectively, and the lines A-A' may be substantially parallel to a first direction substantially parallel a top surface of a substrate.

Figure 2:
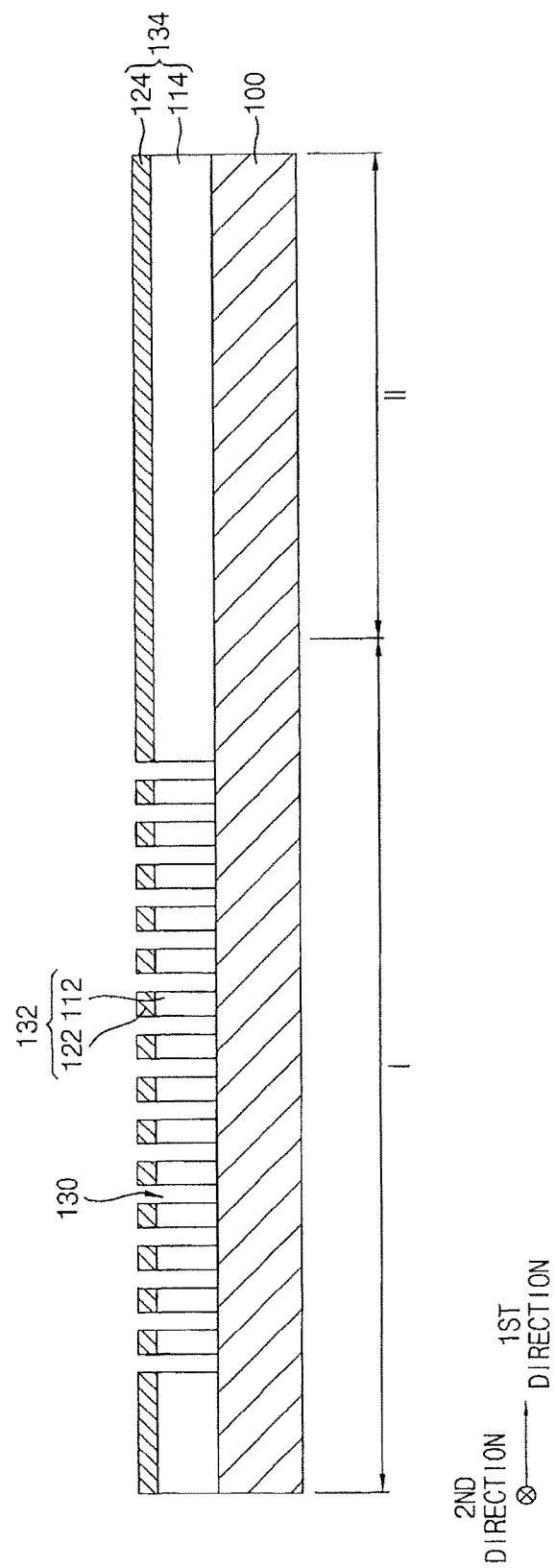
FIGS. 2, 4-6, 8-13, 15-17, 19-20 and 22 are cross-sectional views illustrating stages of a method of forming active patterns in accordance with some example embodiments.

Referring to FIGS. 1 and 2, first and second layers may be sequentially formed on a substrate 100, and a first opening 130 may be formed through the first and second layers to expose a top surface of the substrate 100 thereby forming first structures 132 and second structures 134.

The substrate 100 may include, for example, a semiconductor material, for example, silicon, germanium, silicon-germanium, or the like, or III-V semiconductor compounds, for example, GaP, GaAs, GaSb, or the like. In some example embodiments, the substrate 100 may be a silicon-on-insulator (SOI) substrate or a germanium-on-insulator (GOI) substrate.

The substrate 100 may include first and second regions I and II, respectively. In some example embodiments, the first region I may be a cell region in which memory cells may be formed, and the second region II may be a peripheral circuit region in which peripheral circuits for driving the memory cells may be formed. The second region II may include not only a core/peri region in which the peripheral circuits may be formed, but also an interface region in which wirings of the memory cells, for example, word lines and/or bit lines may contact the peripheral circuits.

Hereinafter, each of the first and second regions I and II may be referred to as a portion of the substrate 100 and also a space over and/or under the substrate 100.

The first layer may be formed of an oxide, for example, atomic layer deposition (ALD) oxide, and the second layer may be formed of, for example, polysilicon. However, the inventive concepts may not be limited thereto, and the first and second layers may be formed of materials having high etching selectivity with respect to each other.

The first opening 130 may be formed by forming a first photoresist pattern (not shown) on the second layer, and sequentially etching the second and first layers using the first photoresist pattern as an etching mask. As a result, first structures 132 and second structures 134 may be formed. Alternatively, the first opening 130 may be formed by a dual patterning technology (DPT) process or a quadruple patterning technology (QPT) process.

In some example embodiments, each of the first openings 130 may be formed to extend in the first region I in a third direction, which may be substantially parallel to the top surface of the substrate 100 and may cross the first direction. That is, the first direction is perpendicular to the second direction, and the third direction extends between the first direction and the second direction and is slanted relative to the first and second directions. The third direction may have an acute angle with the first direction. The plurality of first openings 130 may be formed in a fifth direction, which may be substantially parallel to the top surface of the substrate 100 and substantially perpendicular to the third direction. In some example embodiments, a width of each of the first openings 130 in the fifth direction or in the first direction may be substantially uniform along the third direction, and the first openings 130 may be spaced apart from each other in the fifth direction or in the first direction by a constant distance.

In some example embodiments, the plurality of first openings 130 in the first region I may be formed only at a portion of the first region I, for example, the plurality of first openings 130 may be formed only at a central portion of the first region I. In some example embodiments, in a plan view, the plurality of first openings 130 may be formed in a first rectangular region R1. A portion of the first layer in the first rectangular region R1 may be referred to as a first pattern 112, and a portion of the second layer in the first rectangular region R1 may be referred to as a third pattern 122. That is, the first pattern 112 may be a portion of the first layer between the first openings 130, and the third pattern 122 may be a portion of the second layer between the first openings 130.

Portions of the first layer which are not between the plurality of openings 130, that is, a portion of the first layer in regions of the substrate 100 not within the first rectangular region R1 may be referred to as a second pattern 114. Portions of the second layer which are not between the plurality of openings 130, that is, a portion of the second layer in regions of the substrate 100 not within the first rectangular region R1, may be referred to as a fourth pattern 124.

The first and third patterns 112 and 122 sequentially stacked may define the first structure 132. The second and fourth patterns 114 and 124 may define the second structure 134.

In some example embodiments, since the plurality of first openings 130 may be formed at a central portion of the first region I, the second structure 134 may be formed not only in the second region II but also at an edge of the first region I. That is, the second structure 134 may surround the first rectangular region R1 in the first region I. A width of the first structure 132 in the fifth direction or in the first direction may be substantially uniform along the third direction. A plurality of first structures 132 may be spaced apart from each other in the fifth direction or in the first direction by a constant distance.

Figure 3:
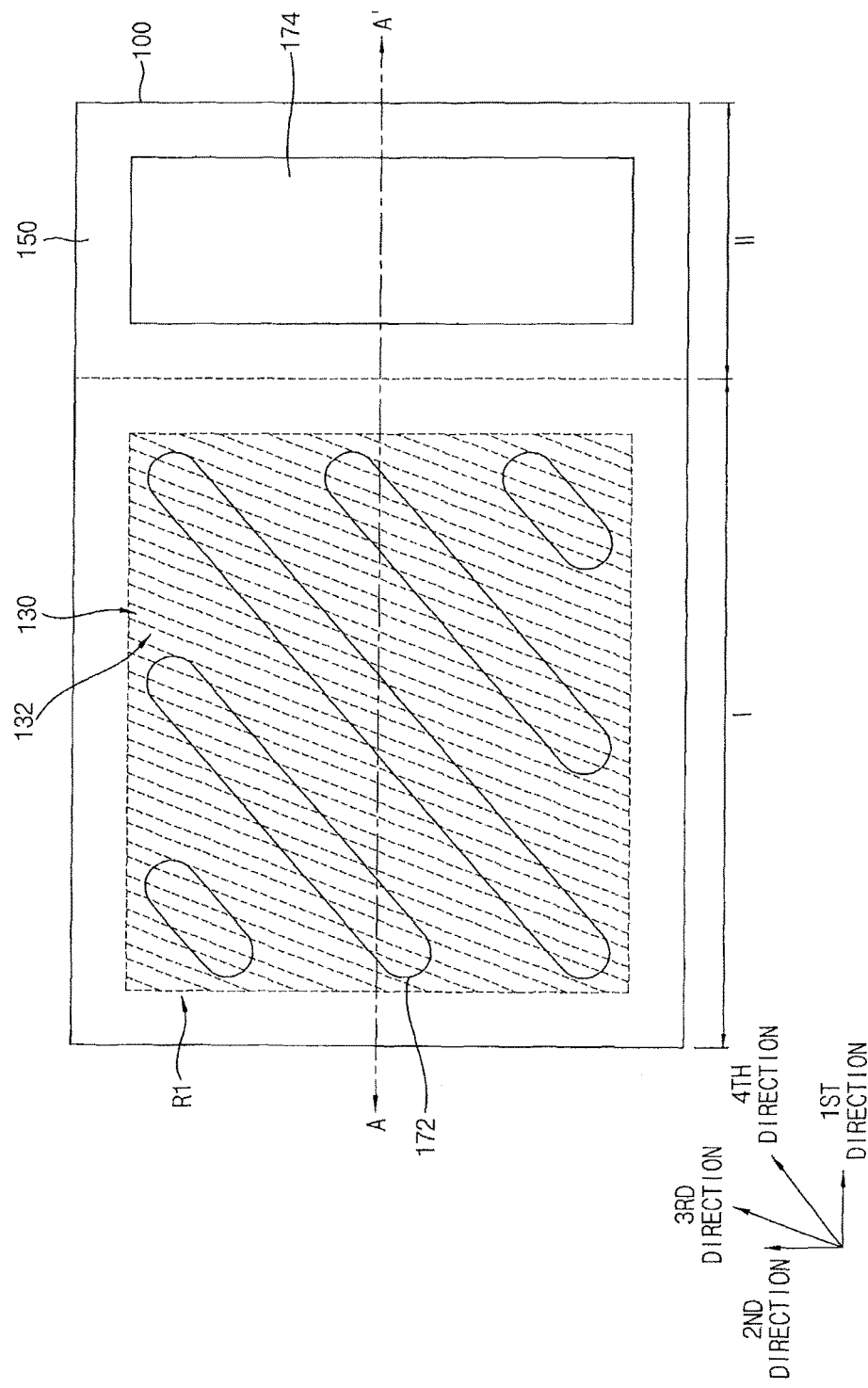
Figure 4:
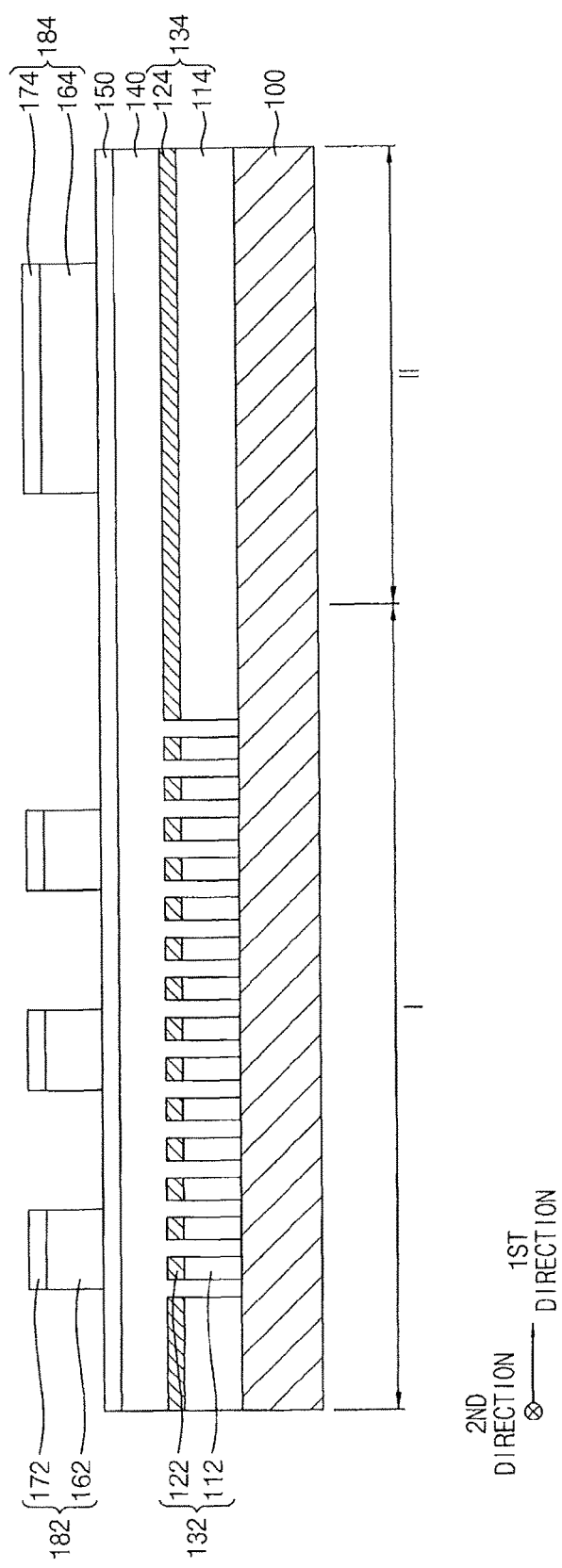

Referring to FIGS. 3 and 4, a third layer 140 may be formed on the exposed top surface of the substrate 100, on the exposed top surfaces of the third and fourth patterns 122 and 124 and filling the first openings 130. A fourth layer 150 may be formed on the third layer 140.

In some example embodiments, the third layer 140 may be formed of, for example, spin-on-hardmask (SOH), and the fourth layer 150 may be formed of an oxynitride, for example, plasma enhanced silicon oxynitride (PE-SION). However, the inventive concepts may not be limited thereto, and the third and fourth layers 140 and 150 may be formed of materials having high etching selectivity with respect to each other.

The third layer 140 may be formed on the third and fourth patterns 122 and 124, and the third layer 140 may serve as a planarization layer or an intermediate layer for providing a flat surface for first and second masks 162 and 164 subsequently formed.

First and second mask layers may be sequentially formed on the fourth layer 150, and may be patterned to form the first and second masks 162 and 164 and third and fourth masks 172 and 174, respectively. The first mask 162 and the third mask 172 may be formed in the first region I, and the second mask 164 and fourth mask 174 may be formed in the second region II. The first and third masks 162 and 172 sequentially stacked in the first region I may be referred to as a third structure 182, and the second and fourth masks 164 and 174 in the second region II may be referred to as a fourth structure 184.

In some example embodiments, the first and second mask layers may be formed of, for example, materials substantially the same as those of the third and fourth layers 140 and 150, respectively. Thus, the first mask layer may be formed of, for example, SOH, and the second mask layer may be formed of an oxynitride, for example, PE-SION. However, the inventive concepts may not be limited thereto, and the first and second mask layers may be formed of materials having low etching selectivity with respect to the third and fourth layers 140 and 150, respectively. In this example embodiment, the first and second mask layers may be formed of materials having high etching selectivity with respect to each other.

The first to fourth masks 162, 164, 172 and 174, respectively, may be formed by forming a second photoresist pattern (not shown) on the second mask layer, and sequentially etching the second and first mask layers using the second photoresist pattern as an etching mask.

In some example embodiments, the third structures 182 may be formed to partially overlap the first structures 132 and the plurality of first openings 130. That is, the third structures 182 may be formed in the first rectangular region R1 to partially cover the first rectangular region R1.

In some example embodiments, each of the third structures 182 may extend in a fourth direction, which may be substantially parallel to the top surface of the substrate 100, and each of the third structures 182 may cross the first and third directions. The plurality of third structures 182 may be formed in a sixth direction, which may be substantially parallel to the top surface of the substrate 100 and may cross the fourth direction. In some example embodiments, a width of each of the third structures 182 in the sixth direction or in the first direction may be substantially uniform along the fourth direction, and a plurality of third structures 182 may be spaced apart from each other in the sixth direction or in the first direction by a constant distance. The fourth direction may be slanted relative to the first, second and third directions and may extend between the first and third directions. The fourth direction may have an acute angle with each of the first and third directions.

The fourth structure 184 may have an arbitrary shape, and the fourth structures 184 may be formed as a single structure, as illustrated, or as a plurality of structures. FIGS. 3 and 4 illustrate that one fourth structure 184 extends in the second direction, which may be substantially parallel to the top surface of the substrate 100 and substantially perpendicular to the first direction, the inventive concepts may not be limited thereto. Thus, the fourth structure 184 may extend, for example, in the first direction, and a plurality of fourth structures 184 may be formed in the first direction and/or in the second direction.

In some example embodiments, a width of the fourth structure 184 may be greater than the width of the third structure 182 in the sixth direction or the first direction.

Figure 5:
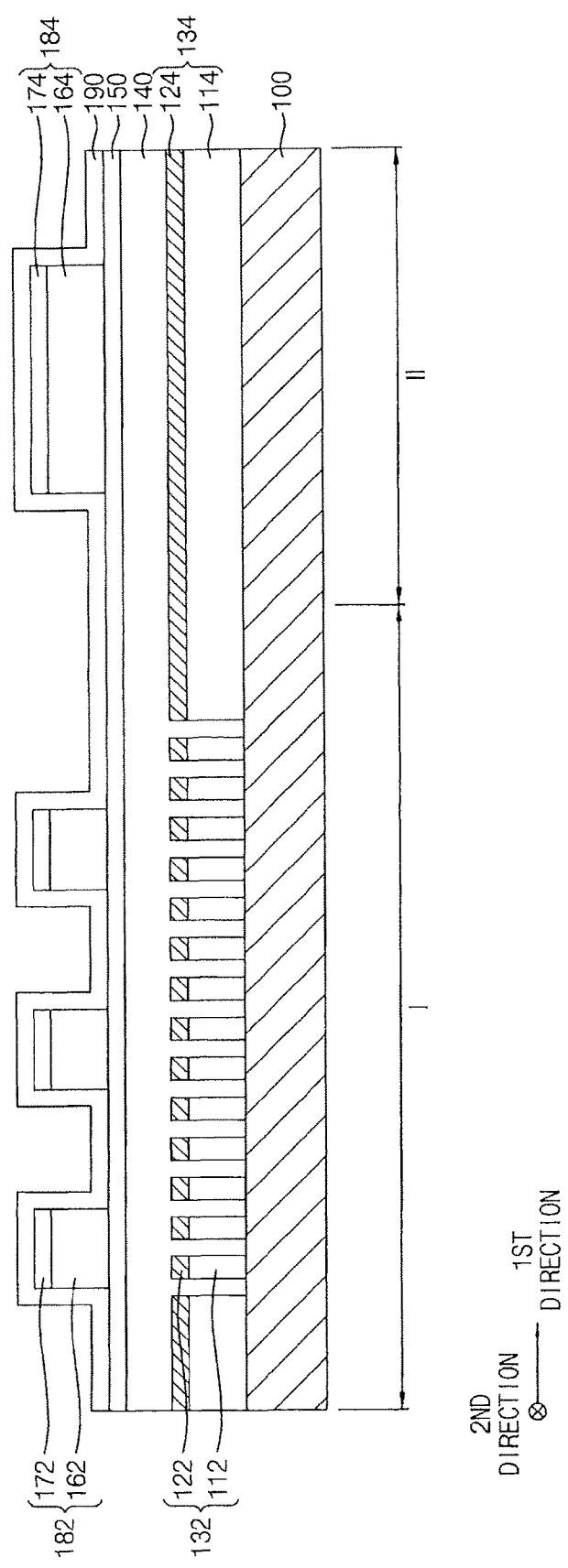

Referring to FIG. 5, a spacer layer 190 may be formed to cover the third and fourth structures 182 and 184 and exposed portions of the fourth layer 150.

In some example embodiments, the spacer layer 190 may be conformally formed on upper surfaces and sidewalls of the third and fourth structures 182 and 184 and the exposed portions of the fourth layer 150. The spacer layer 190 may be formed of, for example, ALD oxide.

Figure 6:
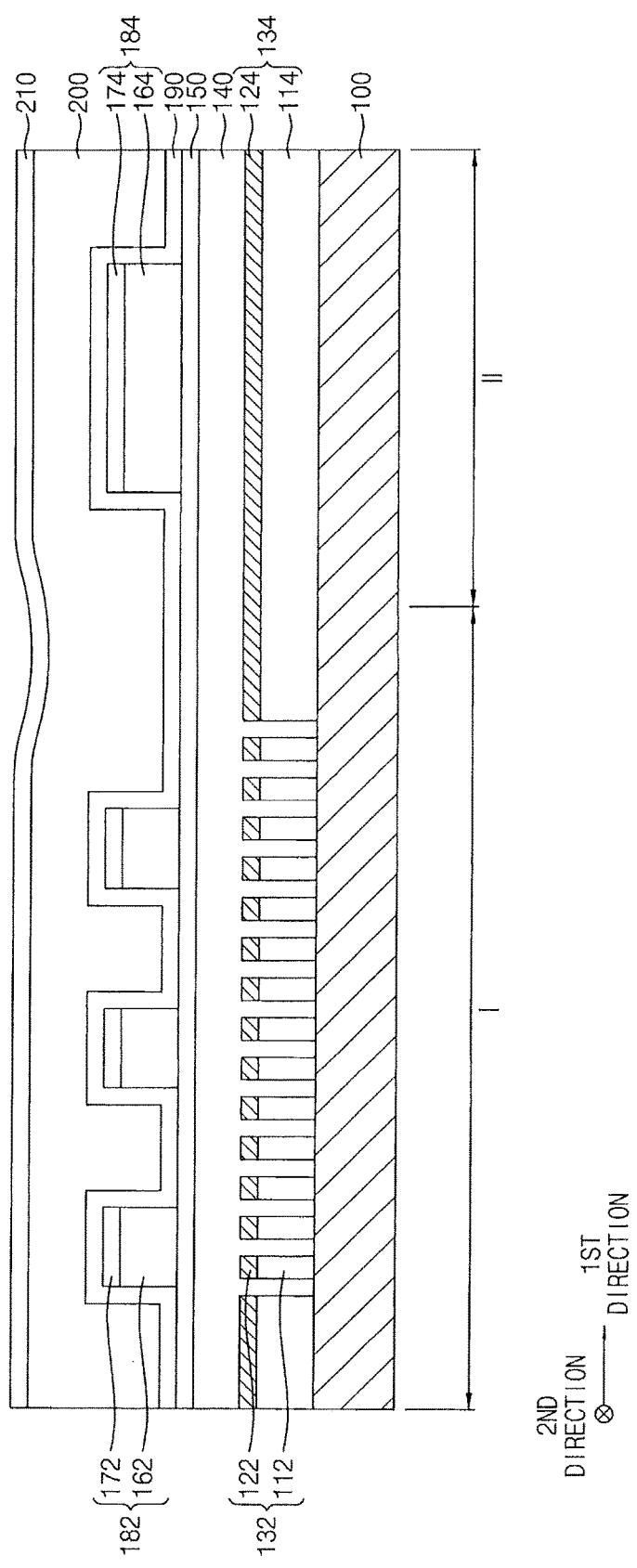

Referring to FIG. 6, a third mask layer 200 and a protection layer 210 may be sequentially formed on the spacer layer 190.

In some example embodiments, the third mask layer 200 may be formed on the spacer layer 190 to a height with which the third mask layer 200 may cover spaces between the third and fourth structures 182 and 184. The third mask layer 200 and the protection layer 210 may have an uneven top surface. That is, the top surfaces of the third mask layer 200 and the protection layer 210 may be uneven along an opening between the third and fourth structures 182 and 184.

In some example embodiments, the third mask layer 200 may be formed of a material substantially the same as that of the first and second masks 162 and 164. Thus, the third mask layer 200 may be formed of, for example, SOH. The protection layer 210 may be formed of a material substantially the same as that of the spacer layer 190. Thus, the protection layer 210 may be formed of, for example, ALD oxide.

Figure 7:
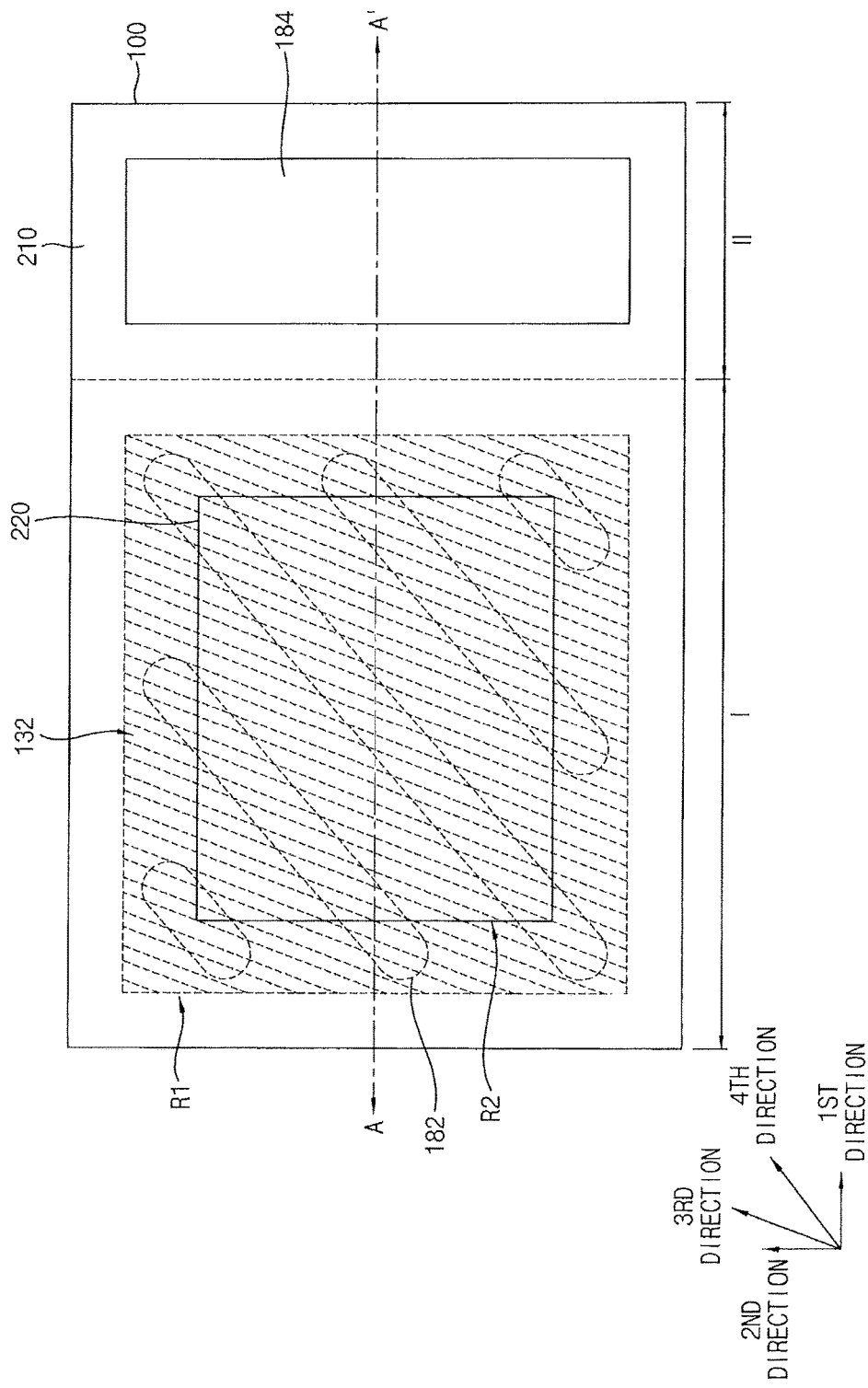
Figure 8:
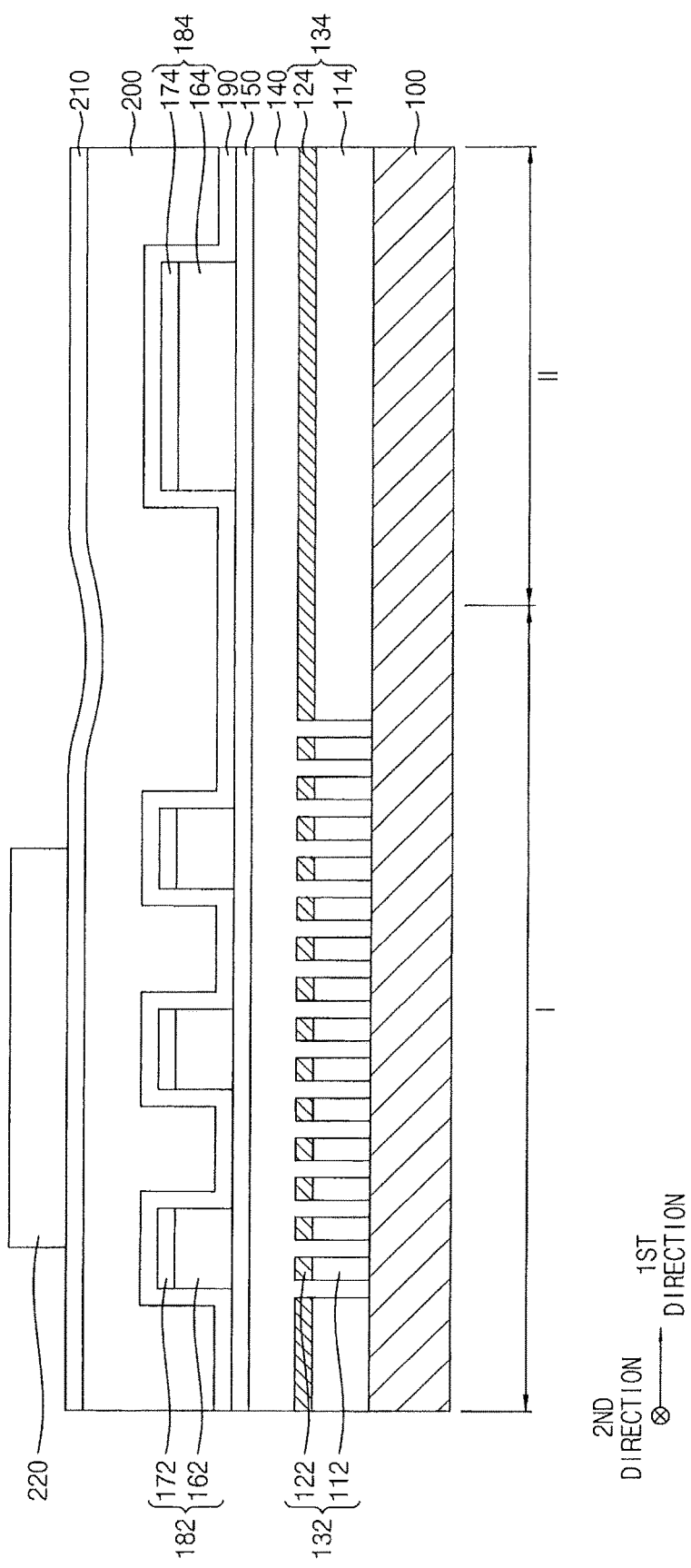

Referring to FIGS. 7 and 8, a fifth mask 220 may be formed on a portion of the protection layer 210. That is, the fifth mask 220 may be formed on a portion of the first region I.

In some example embodiments, the fifth mask 220 may be formed on the portion of the protection layer 210 such that the fifth mask 220 may overlap the third structures 182 and spaces therebetween. In some example embodiments, the fifth mask 220 may include a third photoresist pattern. In example embodiments, the fifth mask 220 may be formed to overlap a portion of the third structures 182 and spaces there between, may thereby form a second rectangular region R2 in a plan view. The second rectangular region R2 may be within the first rectangular region R1 in a plan view, and may be smaller than the first rectangular region R1. That is, portions of the third structures 182 may not be overlapped by the fifth mask 220.

Thus, the fifth mask 220 may cover, for example, a central portion of the first rectangular region R1 in a plan view, and may not cover the second region II, a portion of the first rectangular region R1 not covered by the fifth mask 220, and an edge of the first region I not within the first rectangular region R1. Particularly, the fifth mask 220 may not overlap ends of each of the third structures 182 and portions of the first structures 132 at an edge of the first rectangular region R1. The fifth mask 220 may overlap a central portion of each of the third structures 182, and ends of each of the third structures 182 may extend beyond the fifth mask 220 in the fourth direction.

Figure 9:
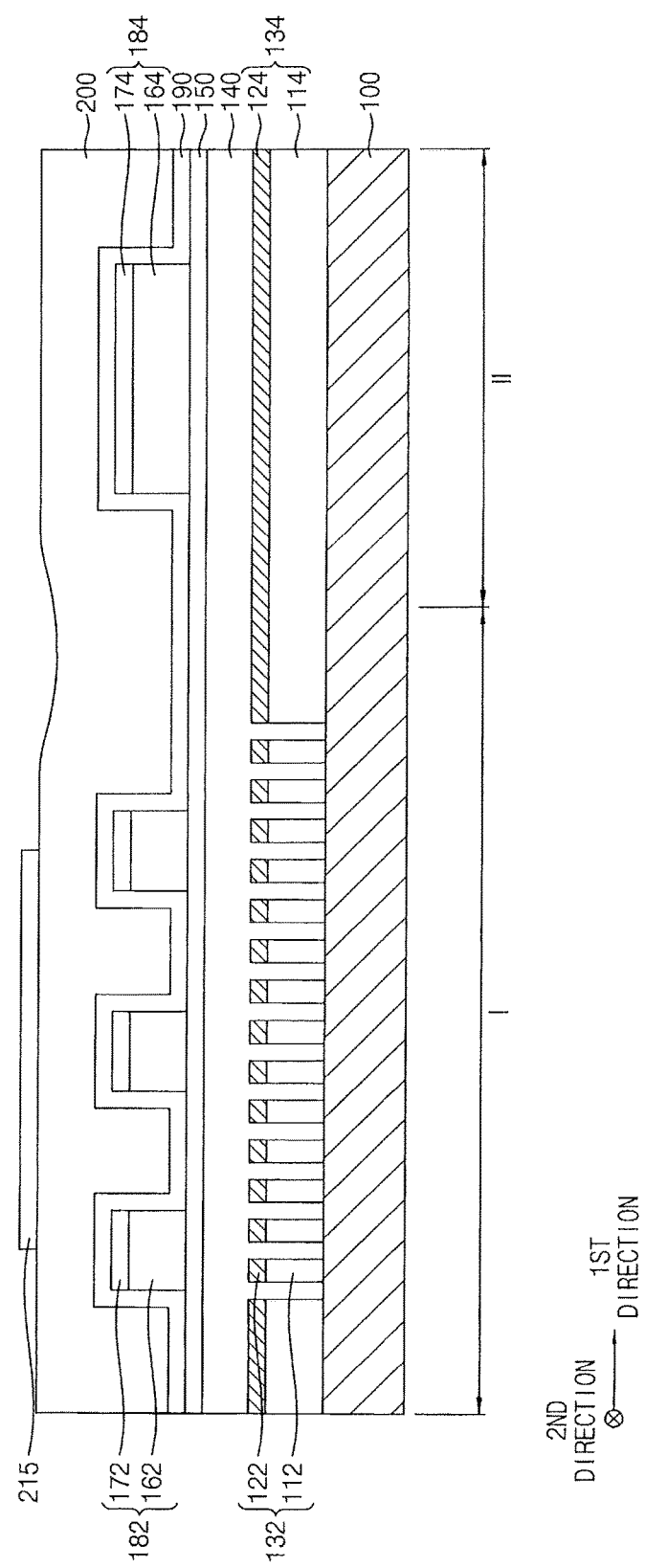

Referring to FIG. 9, the underlying protection layer 210 may be etched using the fifth mask 220 as an etching mask to form a protection pattern 215 partially covering the first region I. A top surface of the third mask 200 may be partially exposed during the etching process.

In some example embodiments, since the fifth mask 220 may be formed in the second rectangular region R2 overlapping portions of the third structures 182 and spaces therebetween, the protection pattern 215 may also be formed in the second rectangular region R2 overlapping the portions of the third structures 182 and the spaces therebetween.

The fifth mask 220 may be removed in the etching process of forming the protection pattern 215.

Figure 10:
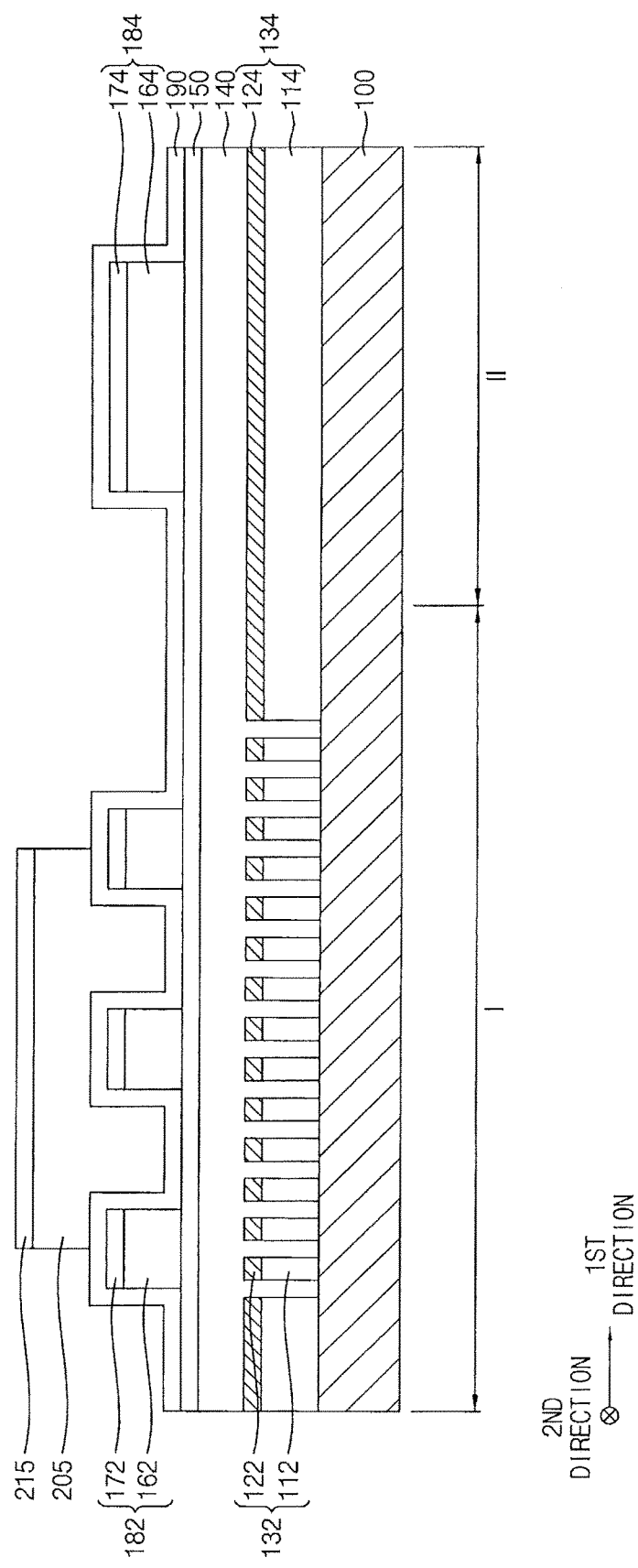

Referring to FIG. 10, the exposed portion of the third mask layer 200 may be removed using the protection pattern 215 as an etching mask, thereby forming a preliminary sixth mask 205 under the protection pattern 215, and a top surface of the spacer layer 190 under the removed portion of the third mask layer 200 may be exposed.

That is, portions of a top surface of the spacer layer 190 on the ends of each of the third structures 182 and the portions of the first structures 132 at the edge of the first rectangular region R1 in the first region I and the second structure 134 on the first region I and the second region II may be exposed.

Figure 11:
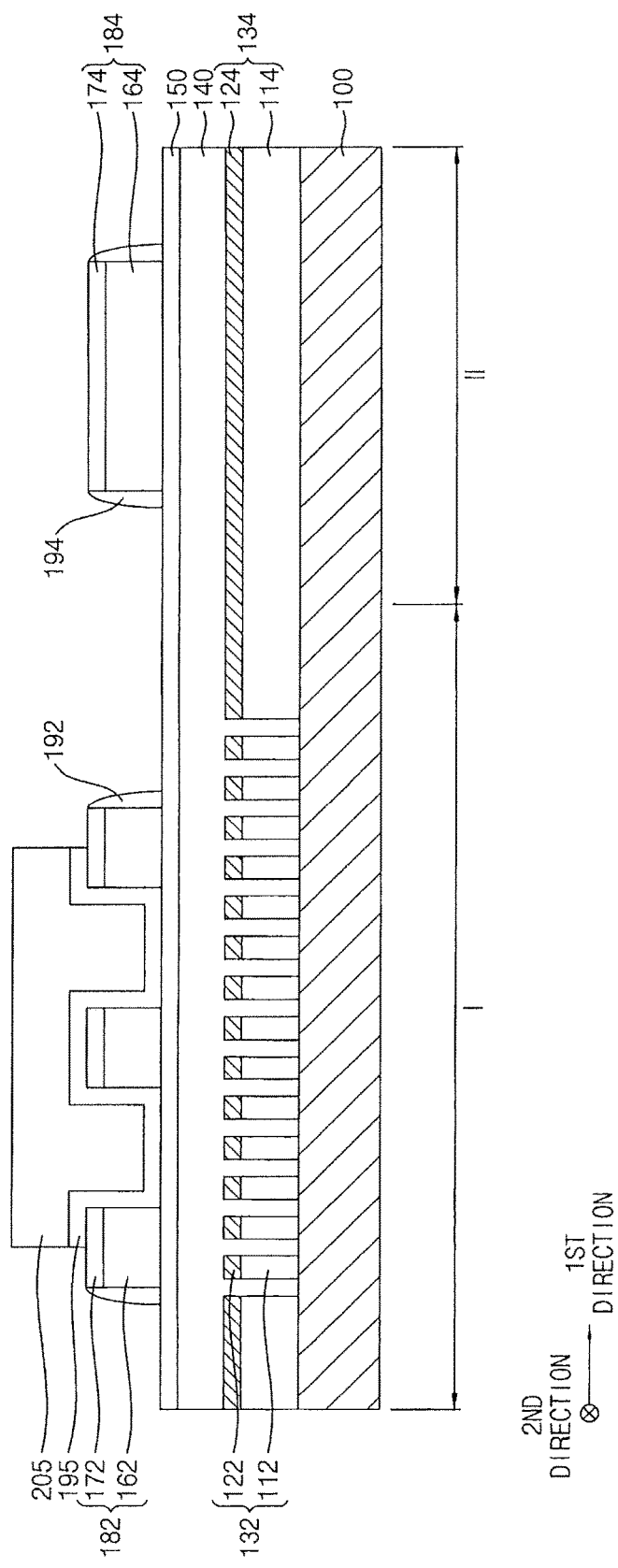

Referring to FIG. 11, the protection pattern 215 and the exposed portions of the top surface of the spacer layer 190 may be removed by, for example, a dry etching process.

Thus, a first spacer layer pattern 195 may be formed under the preliminary sixth mask 205, a first spacer 192 may be formed on sidewalls of the third structures 182 not covered by the preliminary sixth mask 205, and a second spacer 194 may be formed on sidewalls of the fourth structure 184.

Figure 12:
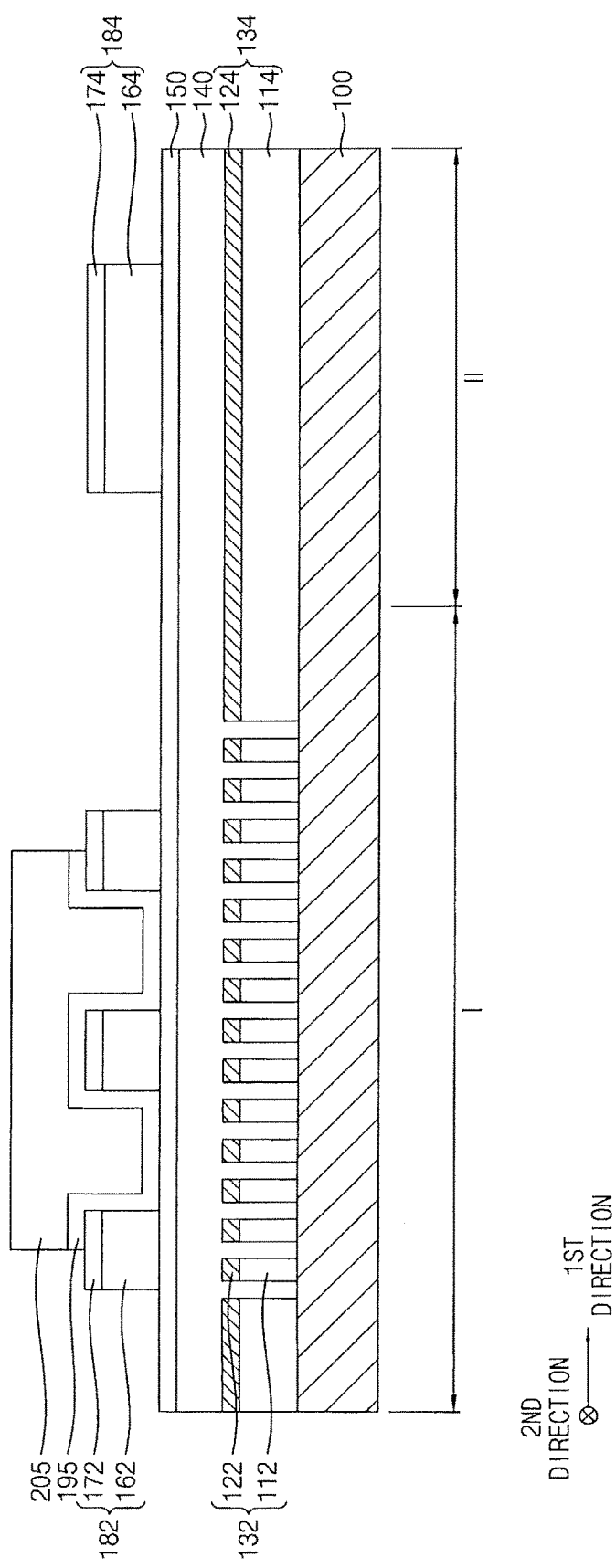

Alternatively, referring to FIG. 12, the protection pattern 215 and the exposed portions of the top surface of the spacer layer 190 may be removed by, for example, a wet etching process.

In this example embodiment, the first spacer layer pattern 195 may be formed under the preliminary sixth mask 205 like that of FIG. 11. However, unlike that of FIG. 11, in this example embodiment, no spacers may be formed on sidewalls of the third and fourth structures 182 and 184.

Hereinafter, for the convenience of explanation, only the embodiments in which the dry etching process is performed will be illustrated.

Figure 13:
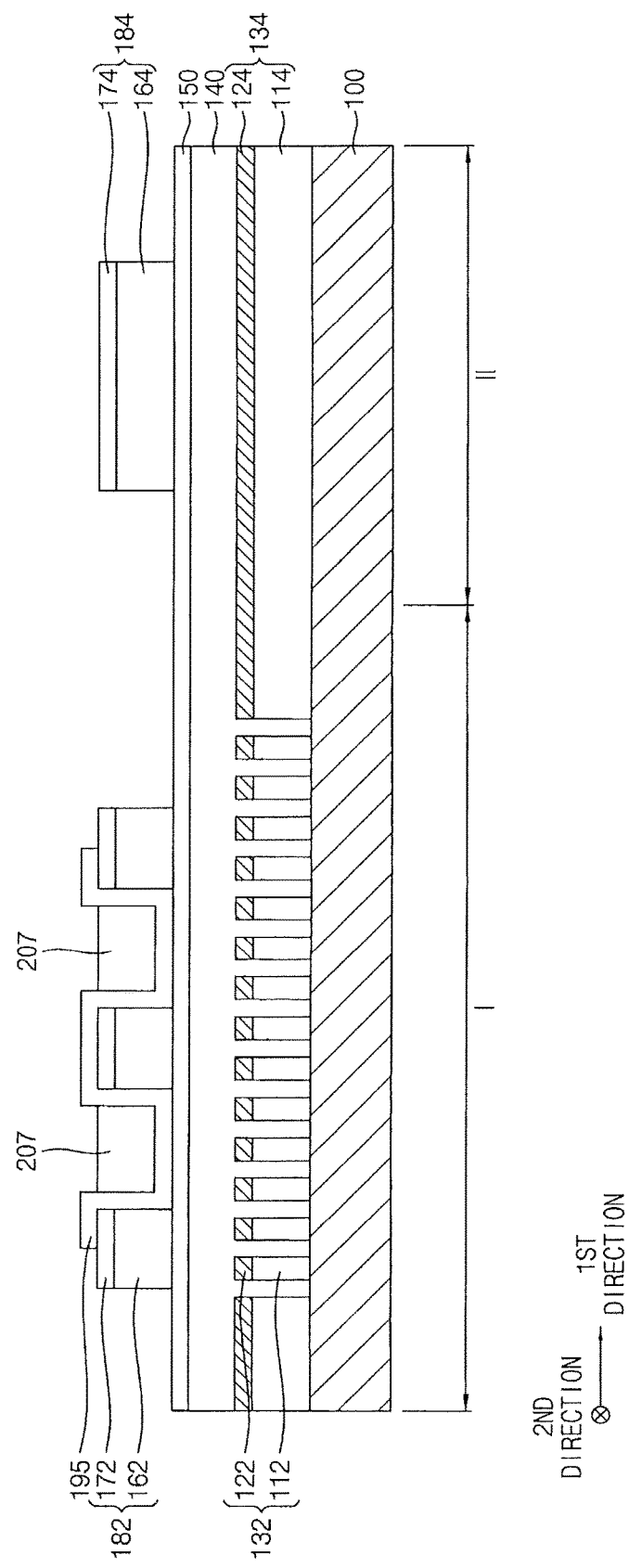

Referring to FIG. 13, an upper portion of the preliminary sixth mask 205 may be removed to form a sixth mask 207.

In some example embodiments, an etch back process may be performed on the preliminary sixth mask 205 to remove the upper portion of the preliminary sixth mask 205. Thus, a portion of an upper surface of the first spacer layer pattern 195 covered by the preliminary sixth mask 205 may be exposed. In some example embodiments, the etch back process may be performed to expose at least a portion of the first spacer layer pattern 195 on the third mask 172. A top surface of the sixth mask 207 may be substantially coplanar with or lower than a top surface of the first spacer layer pattern 195.

The sixth mask 207, which may be formed by removing the upper portion of the preliminary sixth mask 205, may be formed between the third structures 182. In some example embodiments, each of the sixth masks 207 may extend in the fourth direction, and a plurality of sixth masks 207 may be formed in the sixth direction or in the first direction. Each of the sixth masks 207 may be spaced apart from each of the third structures 182 by a thickness of the first spacer layer pattern 195.

Figure 14:
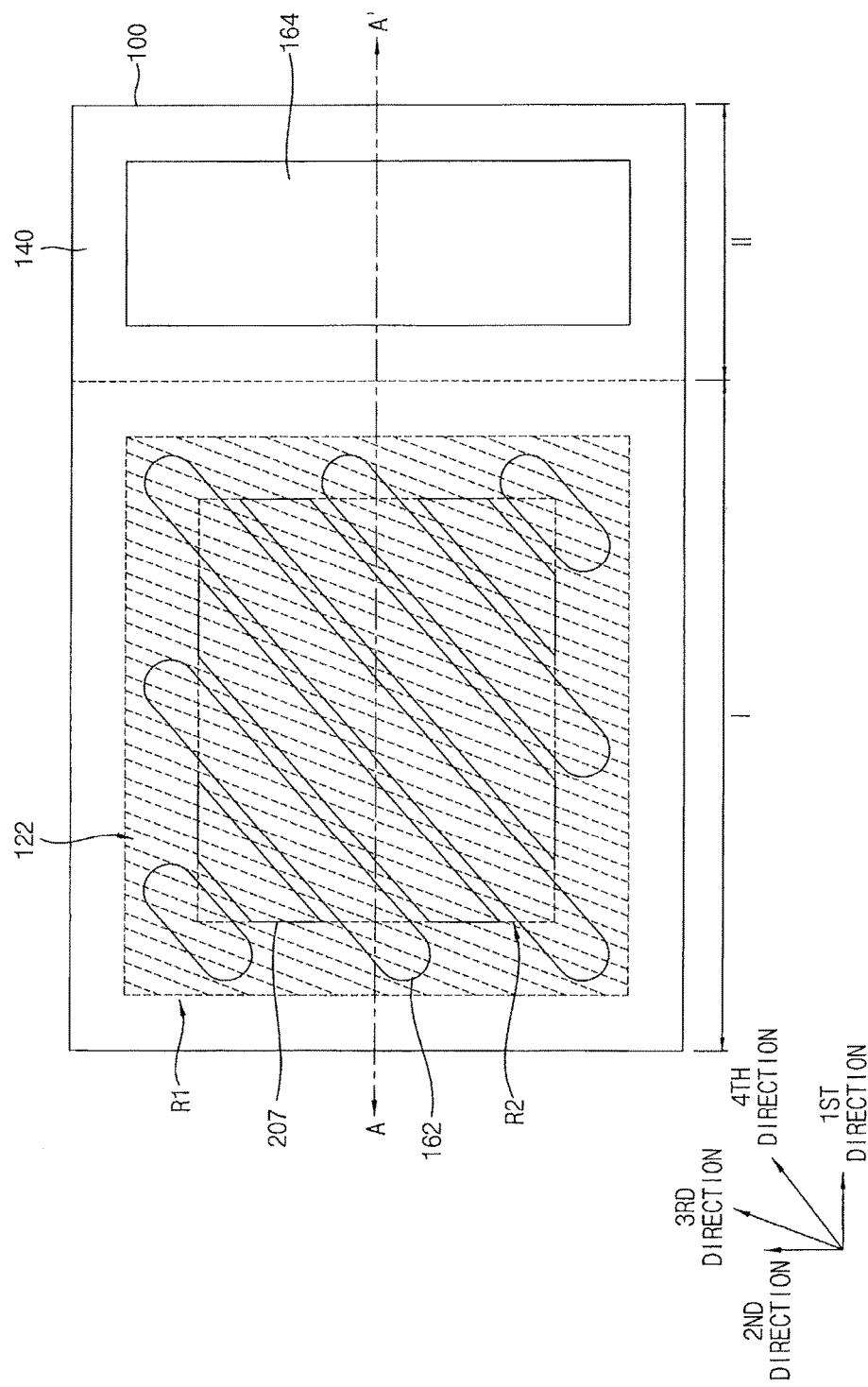
Figure 15:
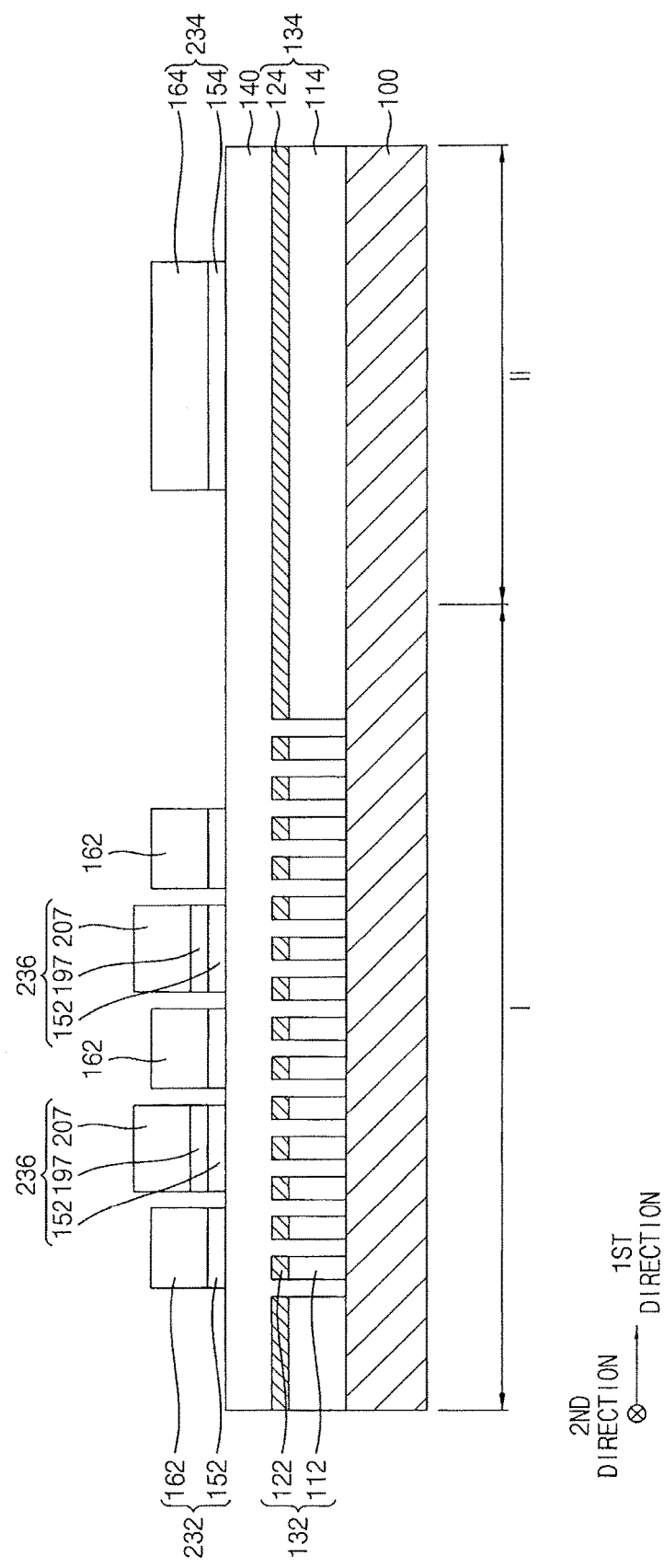

Referring to FIGS. 14 and 15, the first spacer layer pattern 195 and the first and second spacers 192 and 194 (of FIG. 11) may be etched using the third and sixth masks 172 and 207, respectively, as etching masks, and the third mask 172 and the fourth layer 150 may be etched using the sixth mask 207 as an etching mask.

Thus, fifth and sixth patterns 152 and 154, which are each patterned from the fourth layer 150, may be formed under the first and second masks 162 and 164, respectively, a fifth pattern 152, which is patterned from the fourth layer 150, and a second spacer layer pattern 197, which is patterned from the first spacer layer pattern 195, sequentially stacked may be formed under the sixth mask 207, and a top surface of the third layer 140 may be partially exposed. The fifth pattern 152 and the first mask 162 sequentially stacked may be referred to as a fifth structure 232. The sixth pattern 154 and the second mask 164 sequentially stacked may be referred to as a sixth structure 234. The fifth pattern 152, the second spacer layer pattern 197 and the sixth mask 207 sequentially stacked may be referred to as a seventh structure 236.

In some example embodiments, each of the fifth structures 232 may extend in the fourth direction, and a plurality of fifth structures 232 may be formed in the sixth direction or in the first direction. Each of the seventh structures 236 may extend in the fourth direction, and a plurality of seventh structures 236 may be formed in the sixth direction or in the first direction. The sixth structure 234 may extend in the second direction; however, the inventive concepts may not be limited thereto.

In some example embodiments, each of the seventh structures 236 may be formed within the second rectangular region R2 in the first region I. Each of the seventh structures 236 may be formed only within the second rectangular region R2 without extending beyond the outer edges of the second rectangular region R2. Each of the fifth structures 232 may be formed within second rectangular region R2, and ends of each of the fifth structures 232 may be formed at an outside of the second rectangular region R2 in the first region I. Each of the fifth structures 232 may be formed within the first rectangular region R1 as a whole. That is, each of the fifth structures 232 may be formed within the first rectangular region R1 and the second rectangular region R2 without extending beyond the edges of the first rectangular region R1. A length of each of the seventh structures 236 in the fourth direction is less than a length of each of the fifth structures 232 in the fourth direction. The sixth structure 234 may be formed in the second region II.

The fifth and seventh structures 232 and 236 may be spaced apart from each other in the sixth direction or in the first direction. In some example embodiments, the fifth and seventh structures 232 and 236, respectively, may be spaced apart from each other in the sixth direction or in the first direction by a constant distance.

Figure 16:
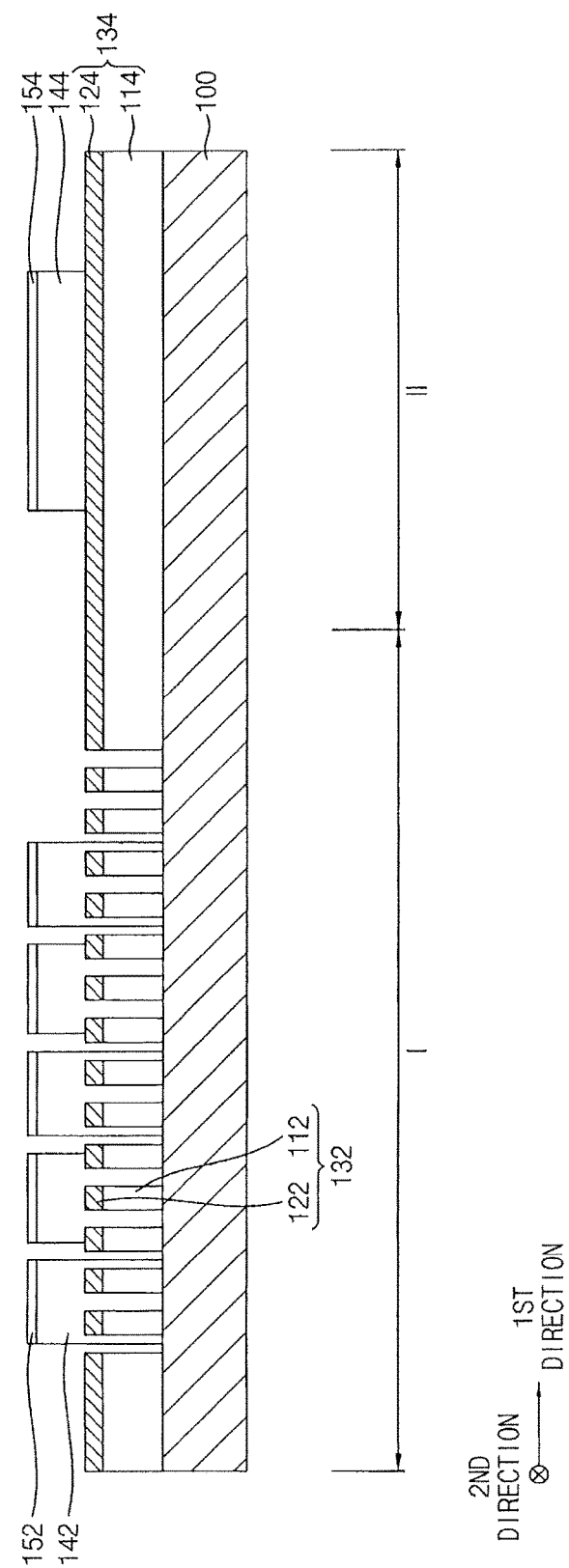

Referring to FIG. 16, the first, second and sixth masks 162, 164 and 207, respectively, and the second spacer layer pattern 197 may be removed. After removing the first, second and sixth masks 162, 164 and 207, respectively, and the second spacer layer pattern 197, the underlying third layer 140 may be etched using the exposed fifth and sixth patterns 152 and 154 as an etching mask.

Thus, the seventh and eighth patterns 142 and 144 may be formed under the fifth and sixth patterns 152 and 154, respectively, and portions of the first and second structures 132 and 134 not overlapped with the fifth and sixth patterns 152 and 154 and a top surface of the substrate 100 within the plurality of openings 130 not overlapped with the fifth and sixth patterns 152 and 154, respectively, may be exposed.

The fifth and sixth patterns 152 and 154 may be partially removed in the etching process such that etched portions of the fifth and sixth patterns 152 and 154 may remain on the seventh and eighth patterns 142 and 144, respectively.

Figure 17:
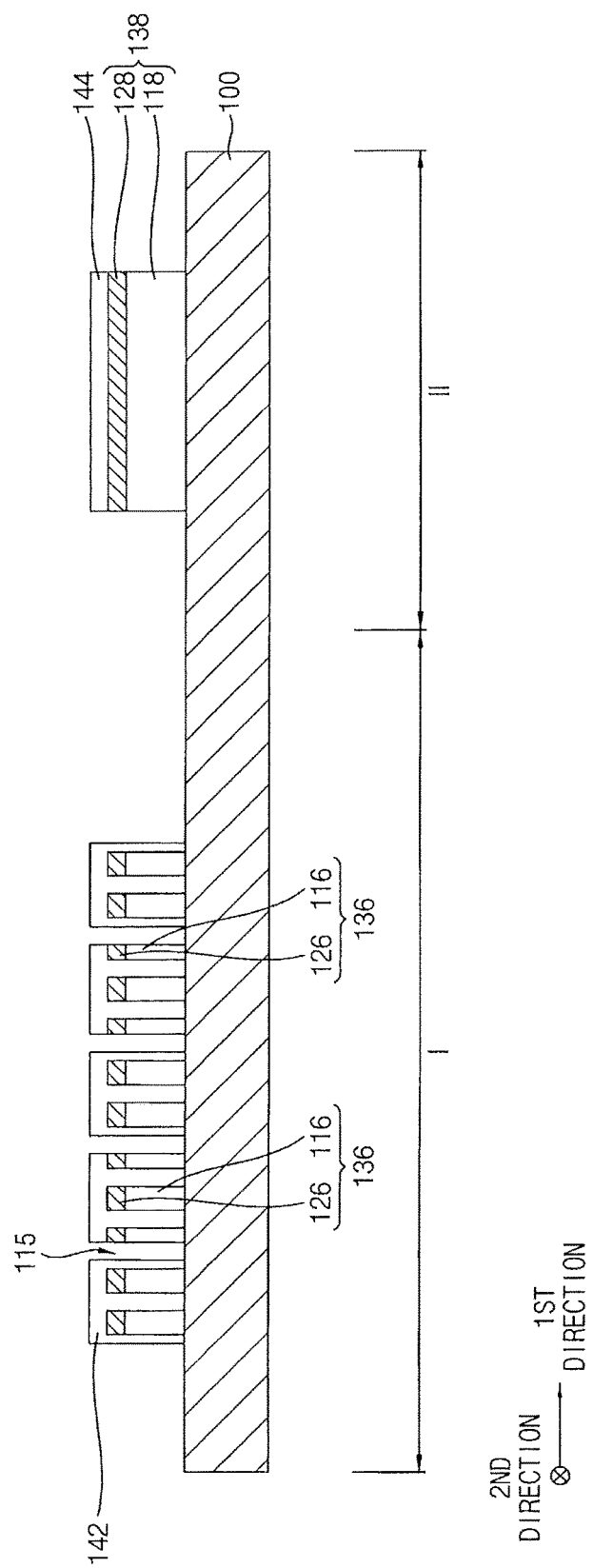

Referring to FIG. 17, the exposed first and second structures 132 and 134 may be etched using the remaining fifth and sixth patterns 152 and 154 and the underlying seventh and eighth patterns 142 and 144 as an etching mask to form eighth and ninth structures 136 and 138, respectively.

In some example embodiments, the third and fourth patterns 122 and 124 of the exposed first and second structures 132 and 134 may be removed using the remaining fifth and sixth patterns 152 and 154 and the underlying seventh and eighth patterns 142 and 144 as an etching mask, respectively, and the fifth and sixth patterns 152 and 154 may be also removed. Then, the first and second patterns 112 and 114 of the exposed first and second structures 132 and 134, respectively, may be removed using the seventh and eighth patterns 142 and 144 as an etching mask, and the seventh and eighth patterns 142 and 144 may be partially removed. Thus, the eighth structure 136 may include ninth and eleventh patterns 116 and 126 sequentially stacked, and the ninth structure 138 may include tenth and twelfth patterns 118 and 128 sequentially stacked.

As the eighth and ninth structures 136 and 138 are formed, a second opening 115 extending in the fourth direction may be formed between tenth structures. Each of the tenth structures may include a portion of the eighth structures 136 and the seventh pattern 142 covering the portion of the eighth structures 136.

Figure 18:
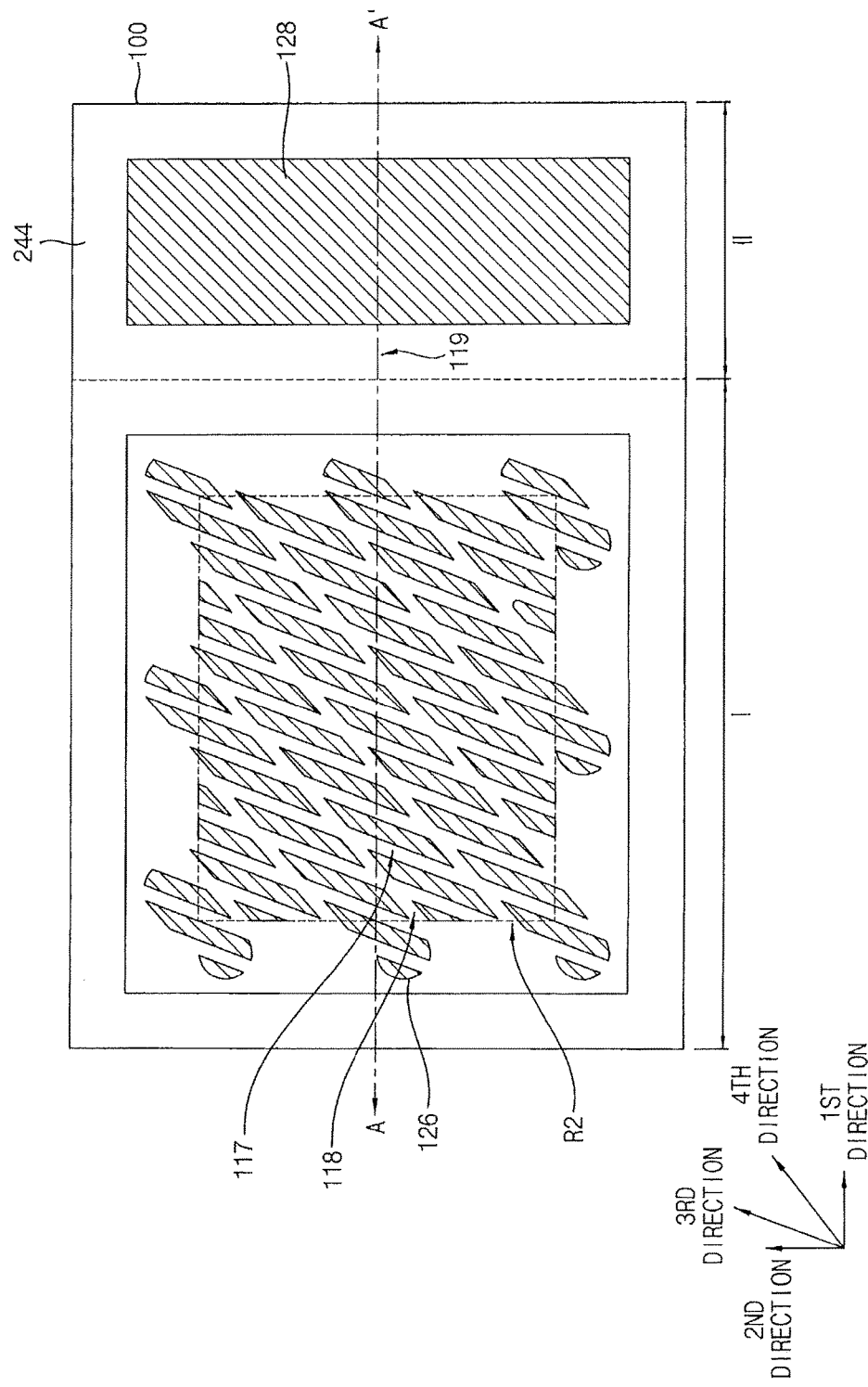
Figure 19:
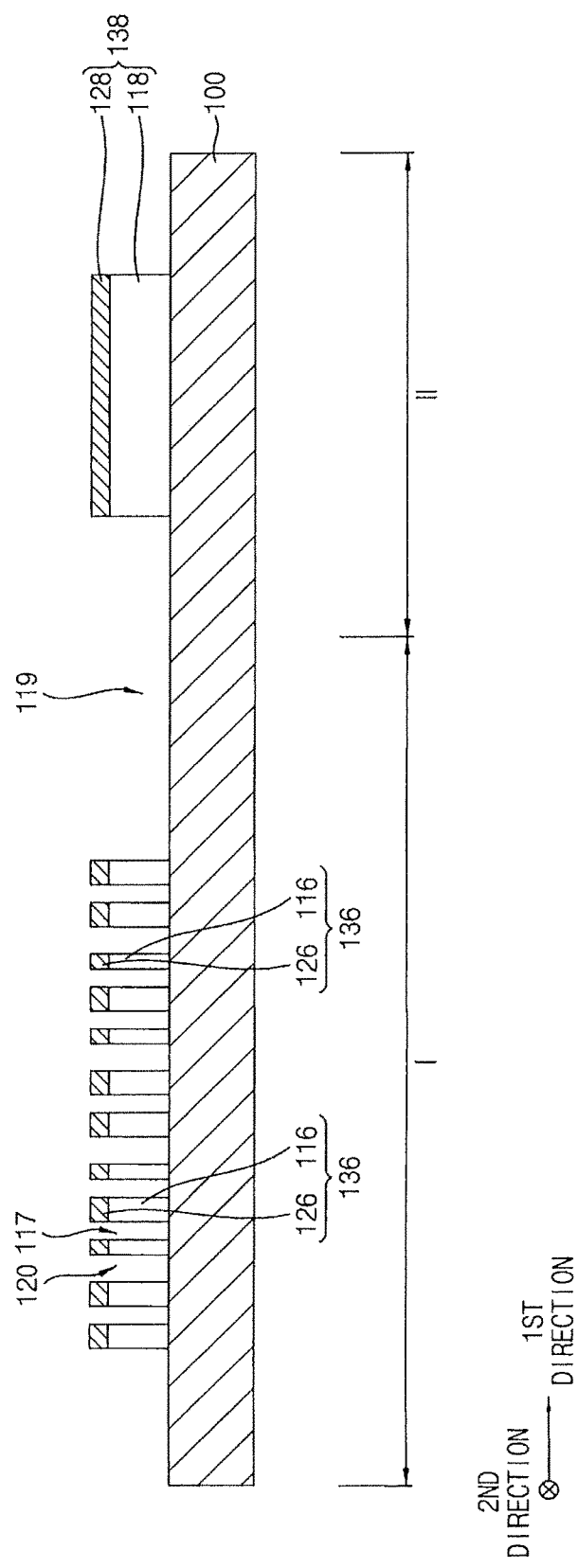

Referring to FIGS. 18 and 19, the seventh and eighth patterns 142 and 144 may be removed to expose the eighth and ninth structures 136 and 138 on the substrate 100 and the substrate 100 therebetween.

In some example embodiments, a plurality of eighth structures 136 may be formed in the third direction, which may define an eighth structure column. A plurality of eighth structure columns may be formed in the fifth direction or in the first direction, which may define an eighth structure array.

A third opening 117 may be formed between the eighth structure columns. A fourth opening 120 may be formed between the eighth structures 136 in each of the eighth structure columns. A fifth opening 119 may be formed between the eighth and ninth structures 136 and 138 or between the ninth structures 138.

Figure 20:
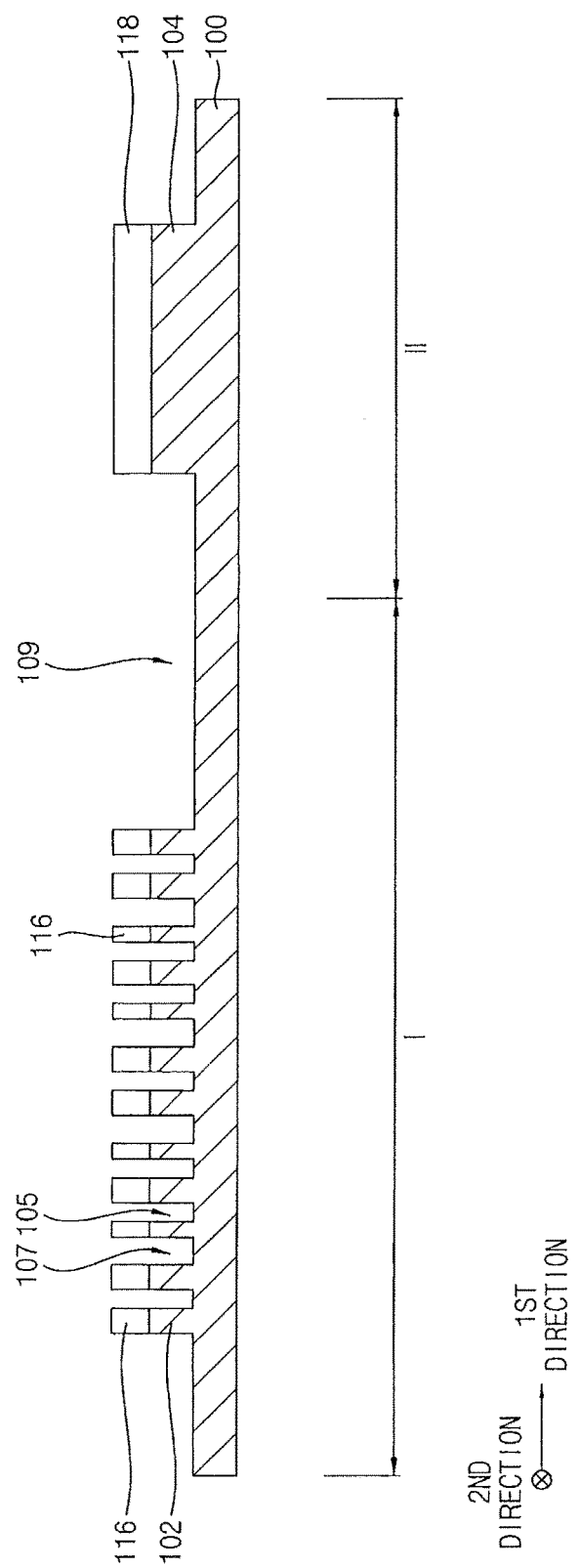

Referring to FIG. 20, an etching process using the ninth and tenth patterns 116 and 118 as an etching mask may be performed to remove the eleventh and twelfth patterns 126 and 128, and also to remove upper portions of the substrate 100 not covered by the ninth and tenth patterns 116 and 118, thereby forming first and second active patterns 102 and 104.

First and second trenches 105 and 107, corresponding to the third and fourth openings 117 and 120, respectively, may be formed between the first active patterns 102, and a third trench 109, corresponding to the fifth opening 119, may be formed between the first and second active patterns 102 and 104 or between the second active patterns 104.

Figure 21:
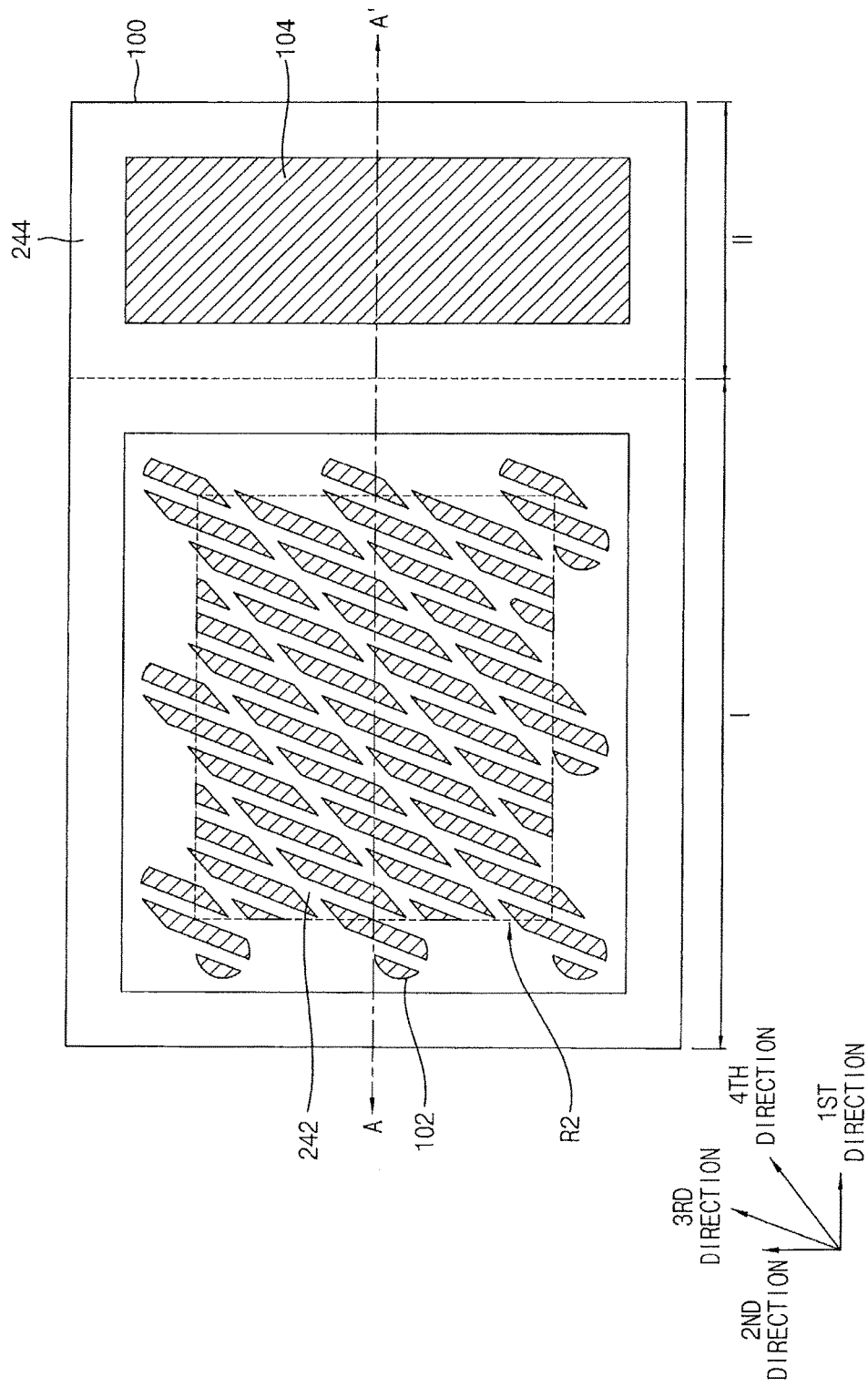
Figure 22:
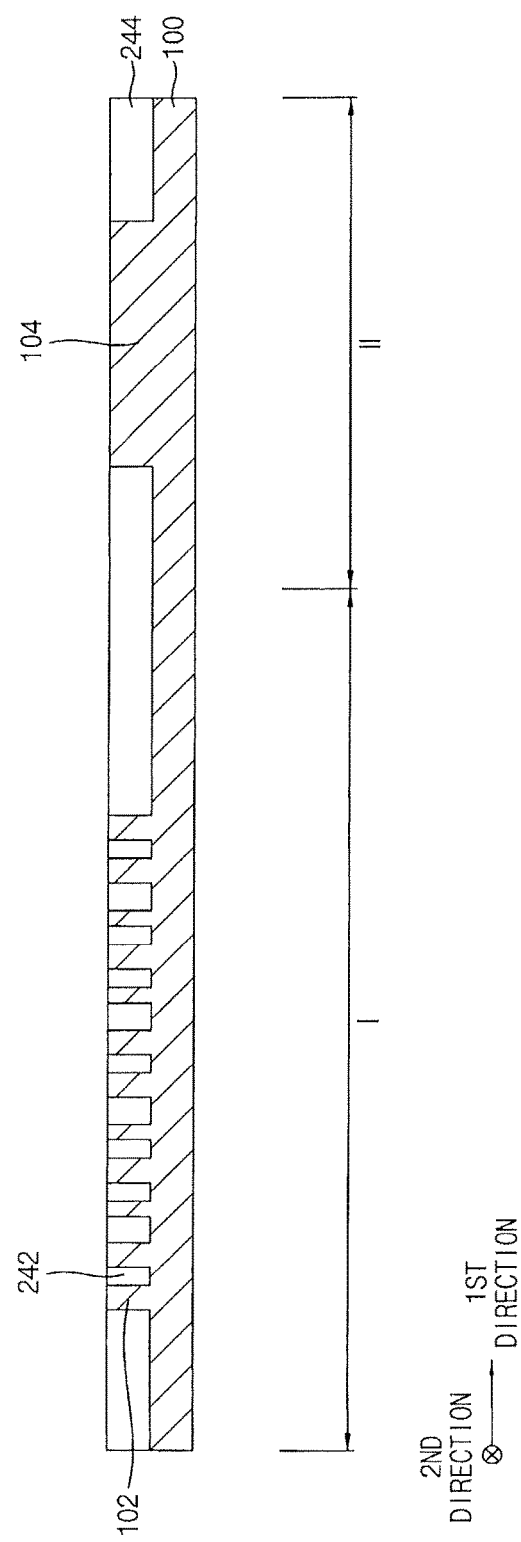

Referring to FIGS. 21 and 22, the ninth and tenth patterns 116 and 118 may be removed to complete the method of forming the first and second active patterns 102 and 104.

A first isolation pattern 242 filling the first and second trenches 105 and 107, and a second isolation pattern 244 filling the third trench 109 may be further formed to define an active region and a field region in the substrate 100. The active region in the first region I may be referred to as a first active region, and the active region in the second region II may be referred to as a second active region.

As illustrated above, in accordance with some example embodiments, the first and second active regions 102 and 104 may be formed in the first region I in which the memory cells may be formed and in the second region II in which the peripheral circuits may be formed, respectively, by the same processes. That is, the first and second active regions in the first region I and the second region II, respectively, may be formed simultaneously.

The first active regions 102 in the first region I may be formed by forming the first structures 132 each extending in the third direction, and etching the first structures 132 using the fifth and seventh structures 232 and 236 extending in the fourth direction crossing the third direction as an etching mask. Thus, each of the first active patterns 102 in the first active region may be formed to be spaced apart from each other by a constant distance not only in the fifth direction to the third direction but also in the third direction.

Each of the first active patterns 102 may be formed in the first region I of the substrate 100, and a plurality of first active patterns 102 may be formed to define the first active region. In some example embodiments, a plurality of first active patterns 102 may be formed to be spaced apart from each other in the third direction, which may define a first active pattern column. A plurality of first active pattern columns may be formed to be spaced apart from each other in the fifth direction or in the first direction, which may define a first active pattern array.

Each of the first active patterns 102 may have a shape of, for example, a parallelogram, including two parallel sides extending in the third direction and two parallel sides extending in the fourth direction in a plan view.

The second active pattern 104 may be formed in the second region II of the substrate 100, and a single second active pattern or a plurality of second active patterns 104 may be formed to define the second active region.

In some example embodiments, in a plan view, the first active patterns 102 may be formed within the second rectangular region R2 at a central portion of the first region I, and further formed at a region protruding from the second rectangular region R2, for example, the portion of the first rectangular region R1 not included within R2. Thus, in a plan view, the whole contour of the first active region including the first active patterns 102 may not be a simple rectangular shape, but may include protrusions protruding from at least one side of the second rectangular region R2. In some example embodiments, the protrusions may protrude from sides of the second rectangular region R2, which may be point symmetrical with respect to a center of the second rectangular region R2.

Figure 23:
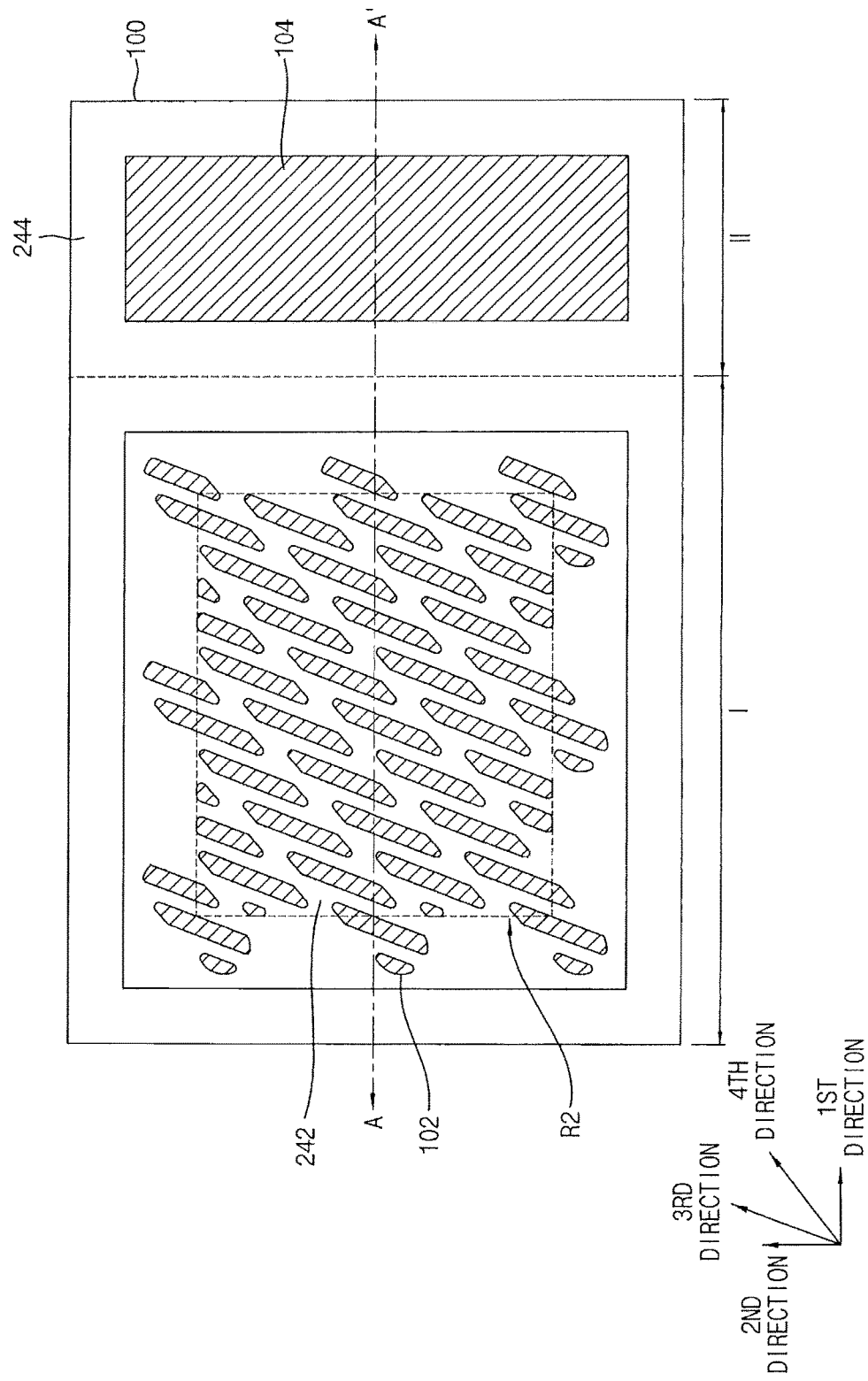

Referring to FIG. 23, in some example embodiments, edges of each of the first active patterns 102 may not be sharp but rounded.

FIGS. 24, 26, 30, 32, 36 and 40 are plan views and FIGS. 25, 27-29, 31, 33-35, 37-39 and 41-42 are cross-sectional views illustrating stages of a method of manufacturing a semiconductor device in accordance with some example embodiments. The cross-sectional views may include cross-sections taken along lines B-B', C-C', D-D' and E-E' of corresponding plan views.

The method of manufacturing the semiconductor device of FIGS. 24-42 may include the processes for forming the active patterns illustrated with reference to FIGS. 1 to 23. The method of manufacturing the semiconductor device of FIGS. 24-42 may be a method of manufacturing a dynamic random access memory (DRAM) device. Like reference numerals refer to like elements, and detailed descriptions thereof are omitted herein. The first to sixth directions in FIGS. 1 to 23 may be used the same as those of FIGS. 24-42.

Figure 24:
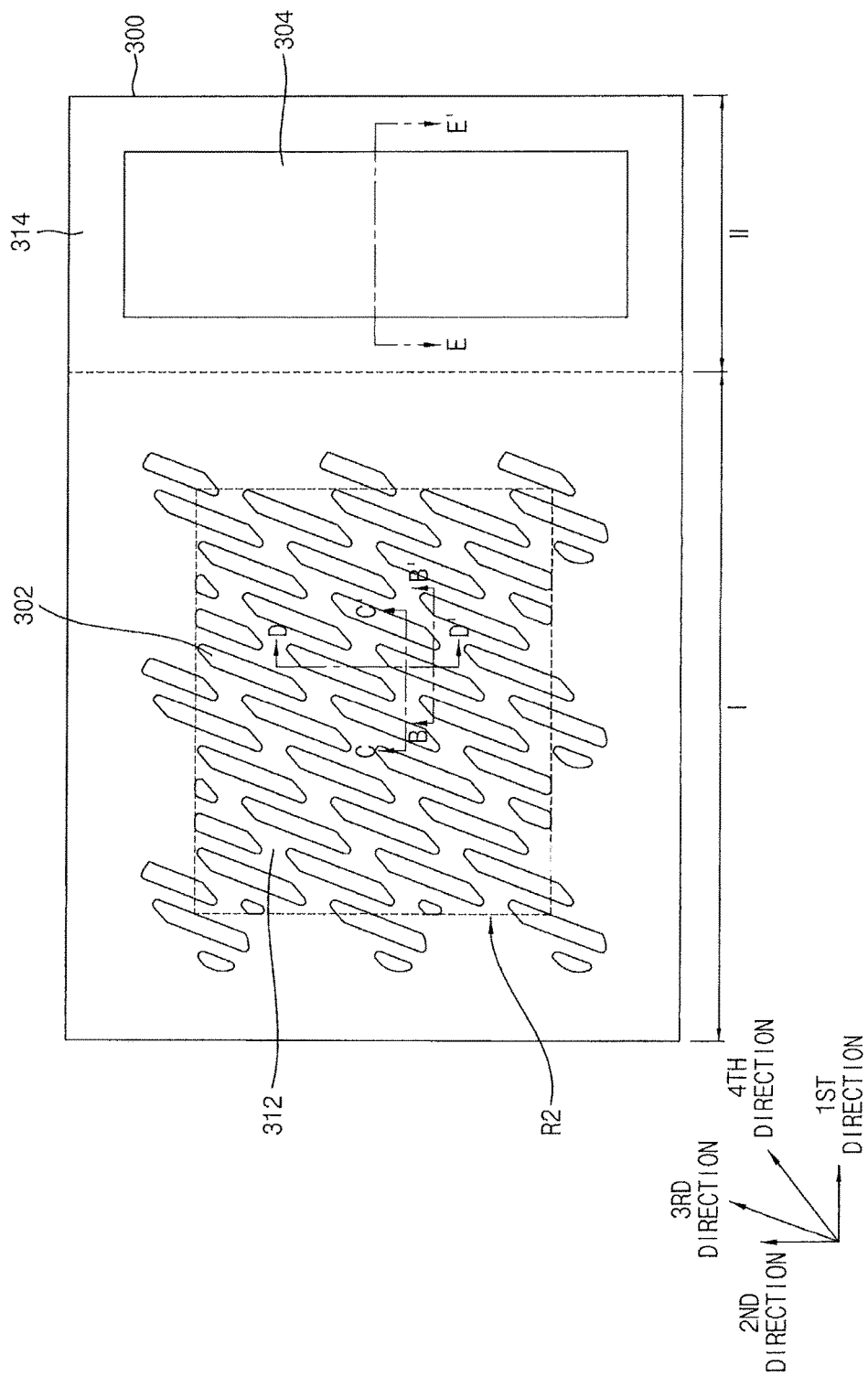
FIGS. 24, 26, 30, 32, 36 and 40 are plan views
Figure 25:
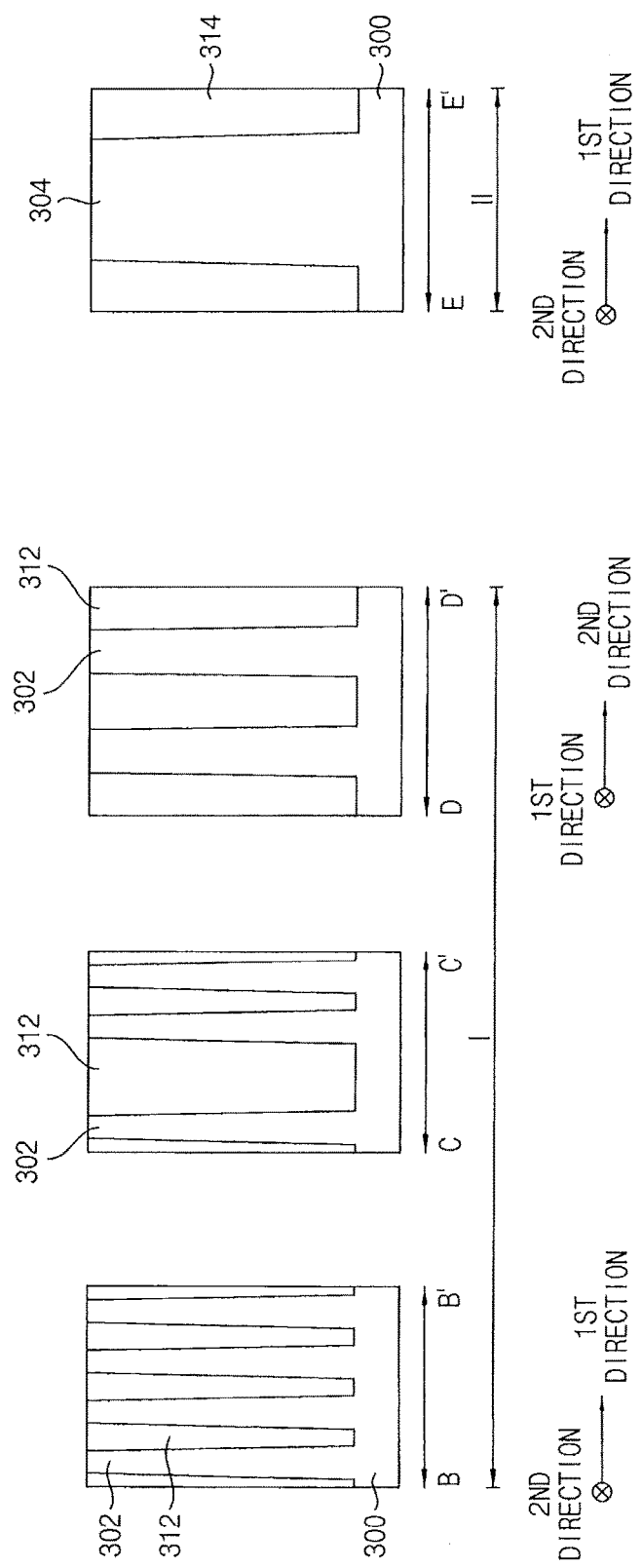
FIGS. 25, 27-29, 31, 33-35, 37-39 and 41-42 are cross-sectional views illustrating stages of a method of manufacturing a semiconductor device in accordance with some example embodiments.

Referring to FIGS. 24 and 25, processes substantially the same as or similar to those illustrated with reference to FIGS. 1 to 23 may be performed to form first and second active patterns 302 and 304 in first and second regions I and II, respectively, of a substrate 300. That is, first and second active patterns 302 and 304 may be substantially similar to first and second active patterns 102 and 104, respectively.

In some example embodiments, the first region I may be a cell region in which memory cells may be formed, and the second region II may be a peripheral circuit region in which peripheral circuits for driving the memory cells may be formed. The second region II may include not only a core/peri region in which the peripheral circuits may be formed, but, also, an interface region in which wirings of the memory cells, for example, word lines and/or bit lines may contact the peripheral circuits.

A plurality of first active patterns 302 may be formed in the third direction, which may define a first active pattern column. A plurality of first active pattern columns may be formed in the fifth direction or in the first direction, which may define a first active pattern array. As described in connection with active patterns 102, each of the first active patterns 302 may have a shape of, for example, a parallelogram, including two parallel sides extending in the third direction and two parallel sides extending in the fourth direction in a plan view. Due to the characteristics of the etching process, edges of each of the first active patterns 302 may not be sharp but rounded. A single second active pattern or a plurality of second active patterns 304 may be formed.

In some example embodiments, in a plan view, the first active patterns 302 may be formed within a second rectangular region R2 at a central portion of the first region I, and further formed at a region protruding from the second rectangular region R2, that is, as described above, within a first rectangular region R1 surrounding second rectangular region R2. Thus, in a plan view, the whole contour of the first active region including the first active patterns 302 may not be a simple rectangular shape, but may include protrusions protruding from at least one side of the second rectangular region R2. In some example embodiments, the protrusions may protrude from sides of the second rectangular region R2, which may be point symmetrical with respect to a center of the second rectangular region R2.

First and second isolation patterns 312 and 314 may be formed in the first and second regions I and II of the substrate 300. That is, the first isolation pattern 312 may be formed between the first active patterns 302, and the second isolation pattern 314 may be formed between the first active pattern 302 and the second active pattern 304, or between the second active patterns 304. The first and second isolation patterns 312 and 314 are substantially similar to first and second isolation patterns 242 and 244, respectively.

Figure 26:
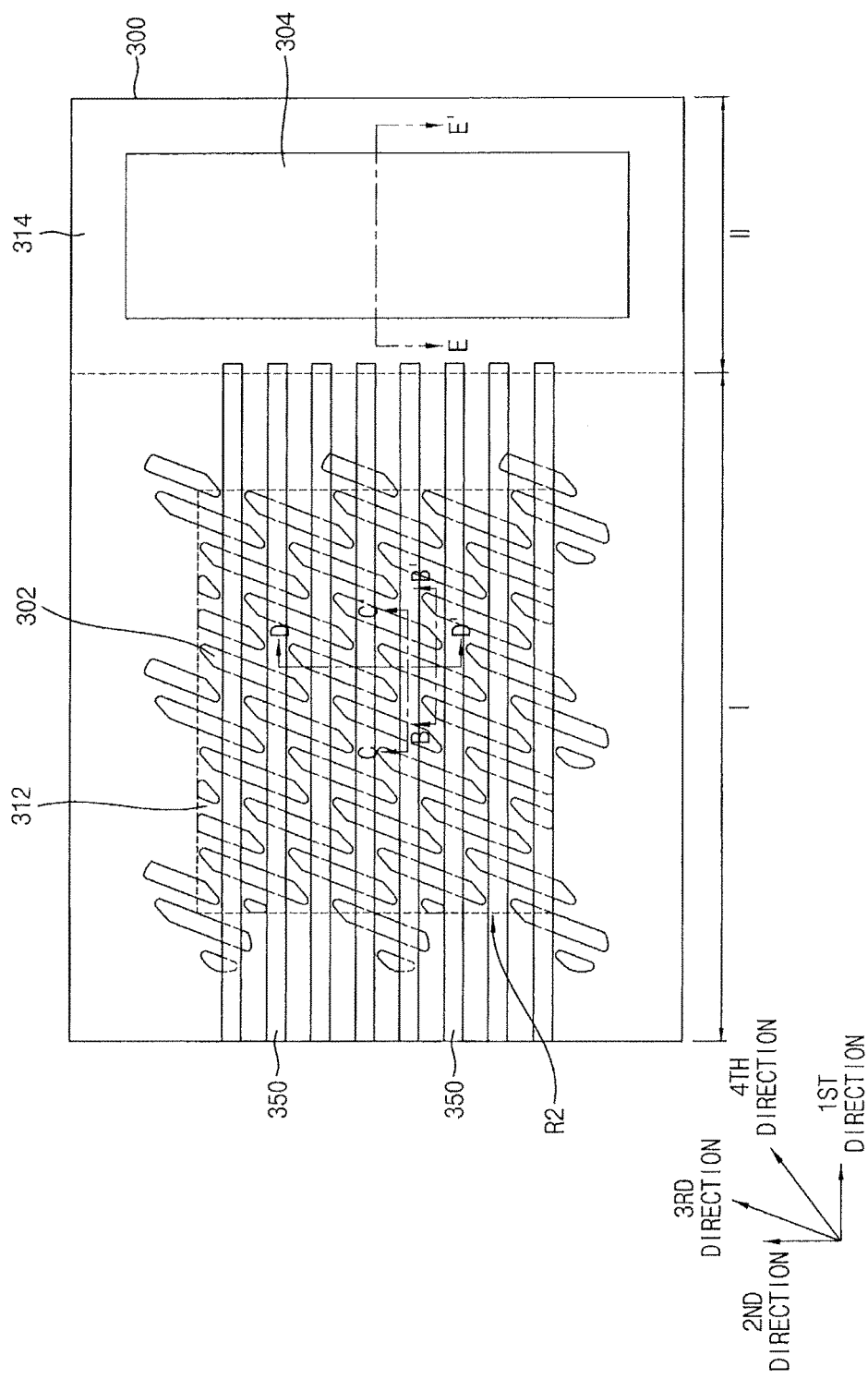
Figure 27:
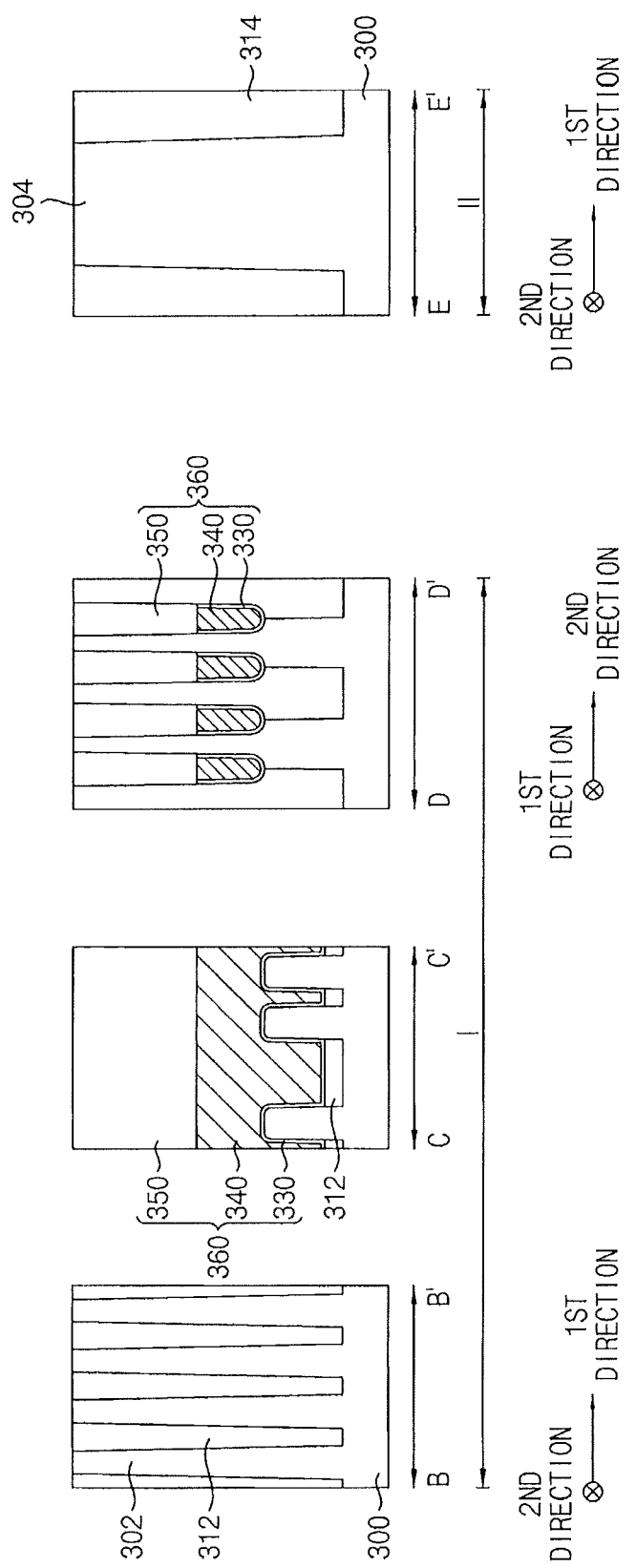

Referring to FIGS. 26 and 27, an ion implantation process may be performed on the first region I of the substrate 300 to form a first impurity region (not shown), and the first region I of the substrate 300 and the isolation patterns 312 and 314 may be partially etched to form first recesses (not shown) extending in the first direction.

Due to the etching selectivity between the substrate 300 and the isolation patterns 312 and 314, the first recesses may be formed to different depths in the substrate 300 and the isolation patterns 312 and 314, respectively. In some example embodiments, two first recesses may be formed in each of the first active patterns 302 of the substrate 300.

A first gate structure 360 may be formed in each of the first recesses. each of the first gate structures 360 may include a first gate insulation layer 330 on a lower inner wall of each of the first recesses, a first gate electrode 340 filling a lower portion of each of the first recesses having the first gate insulation layer 330 thereon, and a capping pattern 350 filling an upper portion of each of the first recesses on the first insulation layer 330 and the first gate electrode 340. Each of the first gate structures 360 may extend in the first direction in the first region I, and a plurality of first gate structures 360 may be formed to be spaced apart in the second direction. Each of the first gate structures 360 may extend in the first direction, and an end of each of the first gate structures 360 may be formed in the second region II, as illustrated in FIG. 26.

In some example embodiments, the first gate insulation layer 330 may be formed on inner walls of the first recesses by, for example, a chemical vapor deposition (CVD) process, and may be formed of an oxide, for example, silicon oxide. Alternatively, the first gate insulation layer 330 may be formed by a thermal oxidation process, and in this example embodiment, may be formed only on a sidewall of the first active pattern 302 exposed by the first recess.

The first gate electrode 340 may be formed by, for example, forming a gate electrode layer on the first gate insulation layer 330, the isolation patterns 312 and 314 and the substrate 300 to sufficiently fill the first recesses, and removing an upper portion of the gate electrode layer by a chemical mechanical polishing (CMP) process and/or an etch back process. Thus, the first gate electrode 340 may be formed in the lower portion of each of the first recesses. An upper portion of the first gate insulation layer 330 may also be removed so that the first gate insulation layer 330 may be formed on the lower inner wall of each of the first recesses, and the gate electrode 340 may be formed on the first gate insulation layer 330 on the lower wall of each of the first recesses. The first gate electrode layer may be formed of a metal, for example, tungsten, titanium, tantalum, or the like, or a metal nitride, for example, tungsten nitride, titanium nitride, tantalum nitride, or the like.

The capping pattern 350 may be formed by forming a capping layer on the first gate electrode 340, the first gate insulation layer 330, the isolation patterns 312 and 314 and the substrate 300 to sufficiently fill remaining portions of the first recesses, and planarizing an upper portion of the capping layer until top surfaces of the isolation patterns 312 and 314 may be exposed. That is, the top surface of the capping pattern 350 may be coplanar, or level, with the top surfaces of the isolation patterns 312 and 314. The capping pattern 350 may be formed in an upper portion of each of the first recesses. The capping pattern 350 may be formed in each of the first recesses on upper surfaces of the gate insulation layer 330 and the gate electrode 340 formed in a lower portion of each of the first recesses. The capping layer may be formed of a nitride, for example, silicon nitride.

Figure 28:
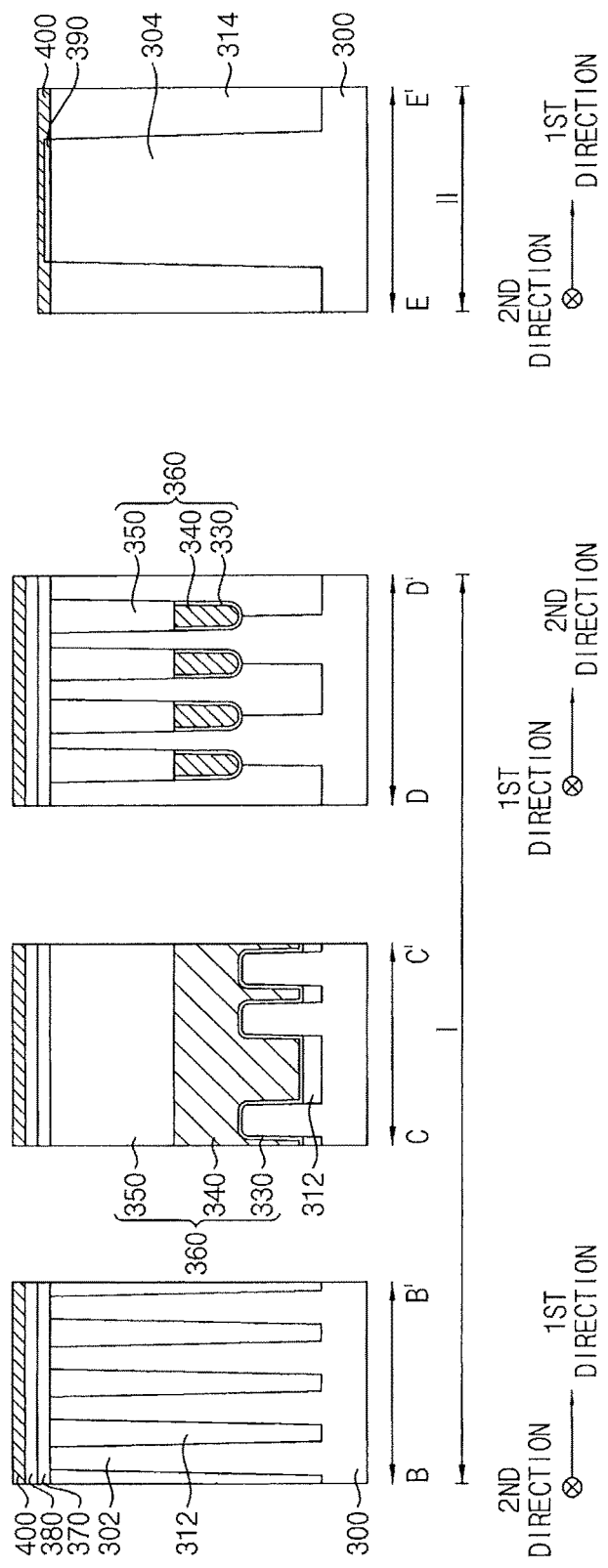

Referring to FIG. 28, a second gate insulation layer 390 may be formed on the second region II of the substrate 300. A pad layer 370 and a first etch stop layer 380 may be sequentially formed on the first region I of the substrate 300, on the isolation patterns 312 and 314 and on the capping pattern 350. A first conductive layer 400 may be formed on the first etch stop layer 380 in the first region I, and on the second isolation pattern 314 and the second gate insulation layer 390 in the second region II.

In some example embodiments, the second gate insulation layer 390 may be formed on the exposed top surface of the second region II of the substrate 300 by a thermal oxidation process, and, thus, the second gate insulation layer 390 may include an oxide, for example, silicon oxide.

The pad layer 370 may be formed of an oxide, for example, silicon oxide, and the first etch stop layer 380 may be formed of a nitride, for example, silicon nitride. Thus, the pad layer 370 and the first etch stop layer 380 may be formed of materials having etching selectivity with respect to each other.

The first conductive layer 400 may be formed of, for example, doped polysilicon.

Figure 29:
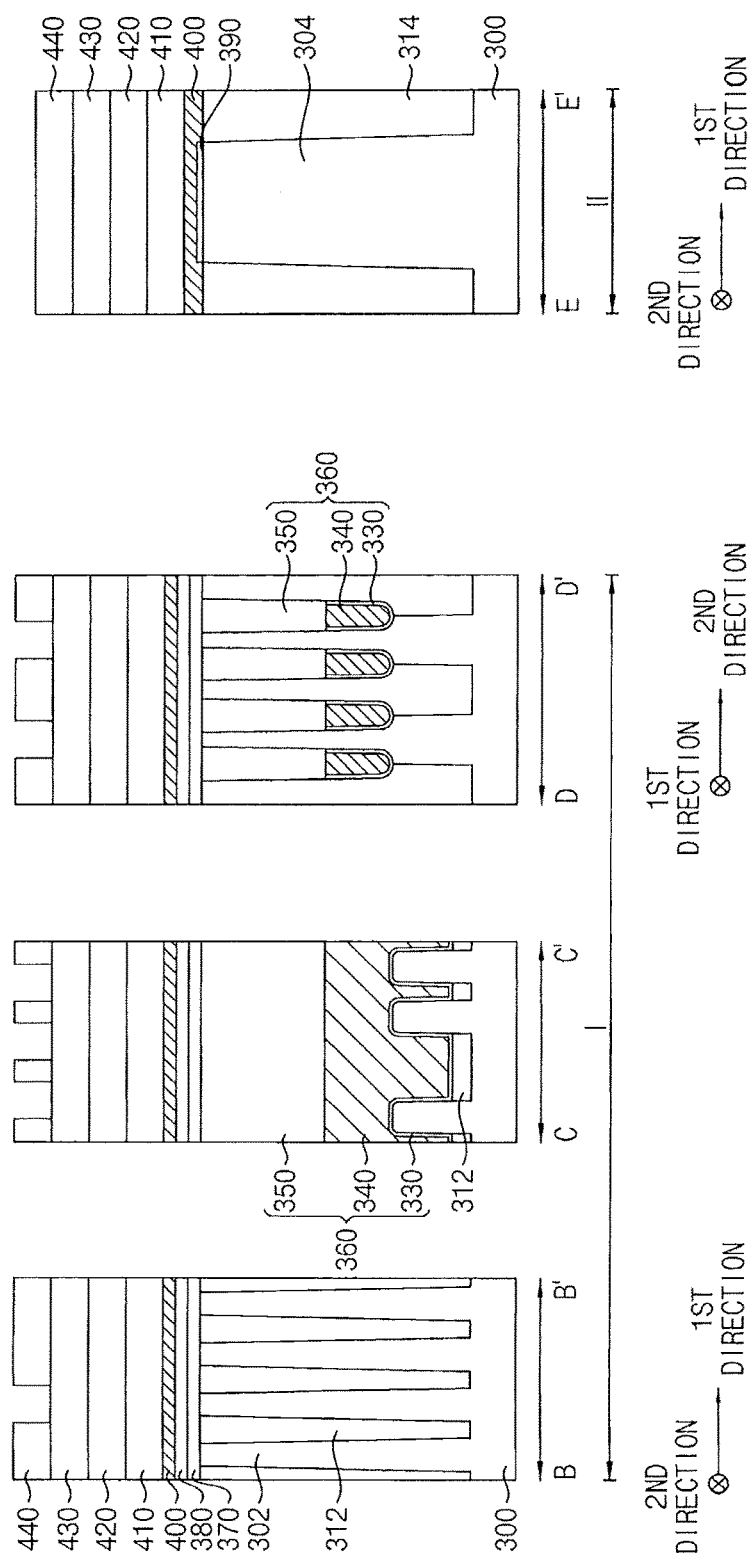

Referring to FIG. 29, fifth, sixth and seventh layers 410, 420 and 430 and a photoresist pattern 440 may be sequentially formed on the first conductive layer 400. The photoresist pattern 440 may be formed to partially expose a top surface of the seventh layer 430 in the first region I.

The fifth layer 410 may be formed of an oxide, for example, silicon oxide, the sixth layer 420 may be formed of, for example, amorphous carbon layer (ACL), and the seventh layer 430 may be formed of, for example, silicon oxynitride.

Figure 30:
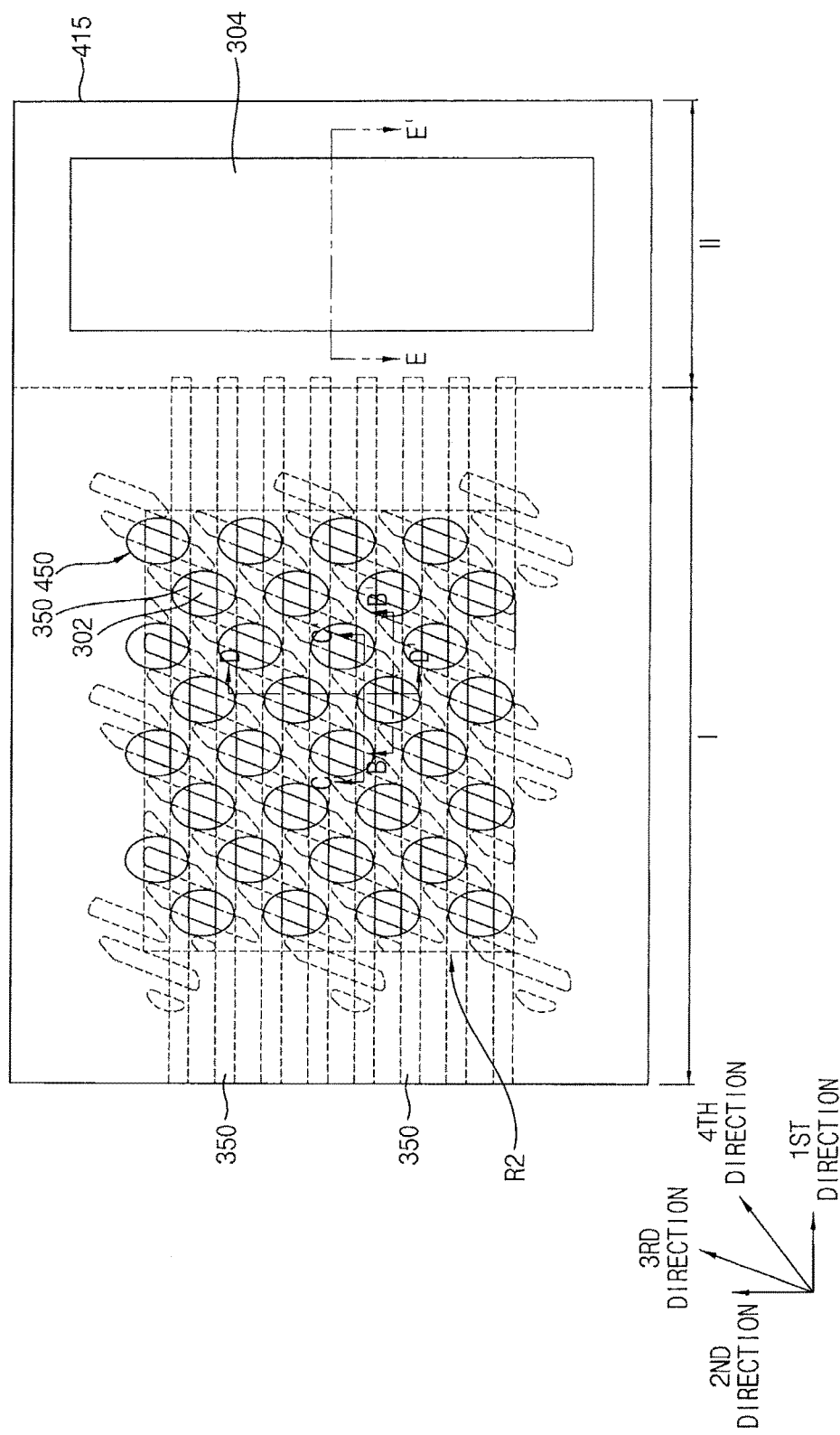
Figure 31:
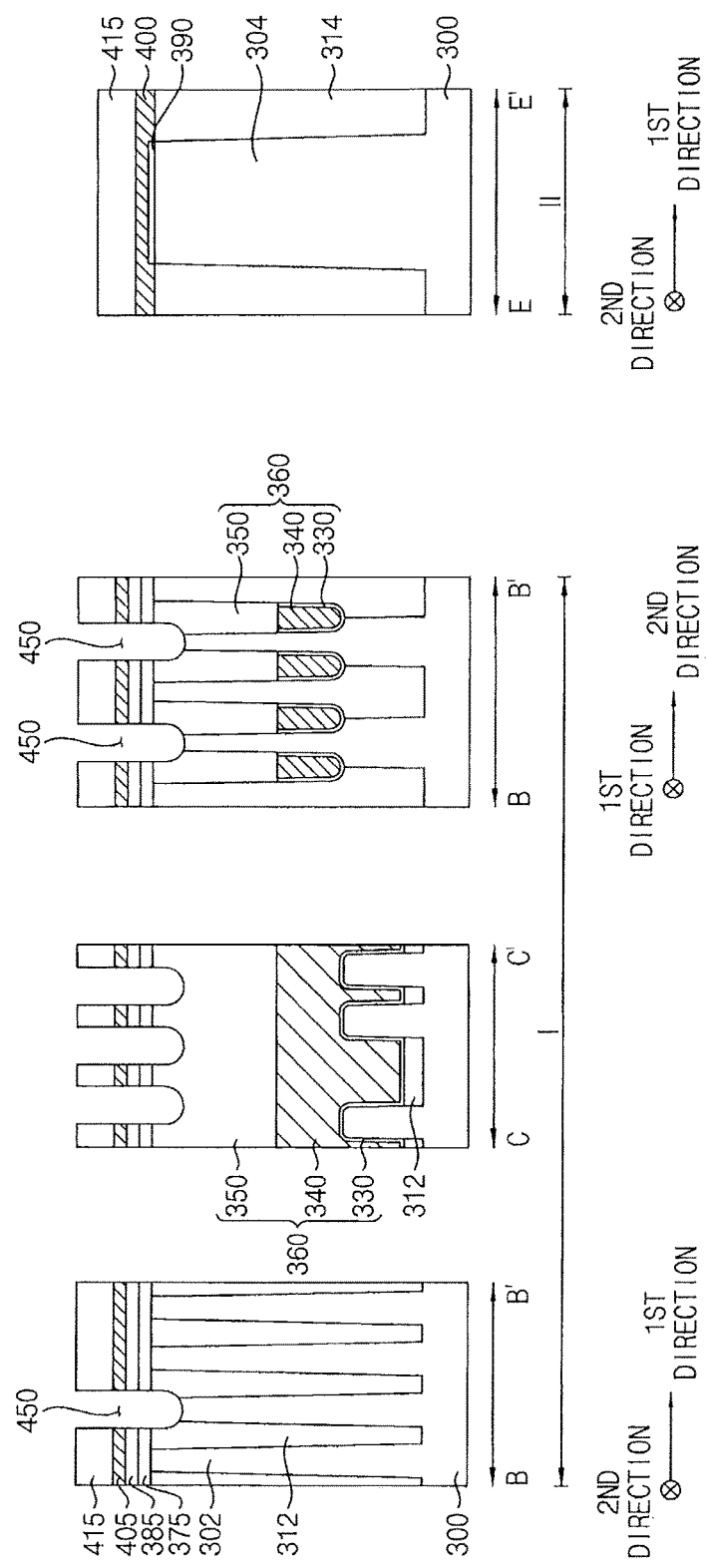

Referring to FIGS. 30 and 31, the fifth, sixth and seventh layers 410, 420 and 430 may be sequentially patterned using the photoresist pattern 440 as an etching mask. The first conductive layer 400, the first etch stop layer 380, the pad layer 370 and an upper portion of the substrate 300 may be partially etched using the fifth layer pattern 415 formed by the patterning process to form a plurality of second recesses 450 in the first region I, a first conductive pattern 405, a first etch stop pattern 385 and a pad pattern 375.

In some example embodiments, the second recesses 450 may be formed at upper portions of the first active patterns 302, respectively, and, thus, may be formed both in the first and second directions.

According to the etching process, the pad pattern 375, the first etch stop pattern 385 and the first conductive pattern 405 may be formed in the first region I. During the etching process, the capping pattern 350 and the first isolation pattern 312 may be partially removed.

The second gate insulation layer 390 and the first conductive layer 400 may remain under the fifth layer pattern 415 in the second region II.

Figure 32:
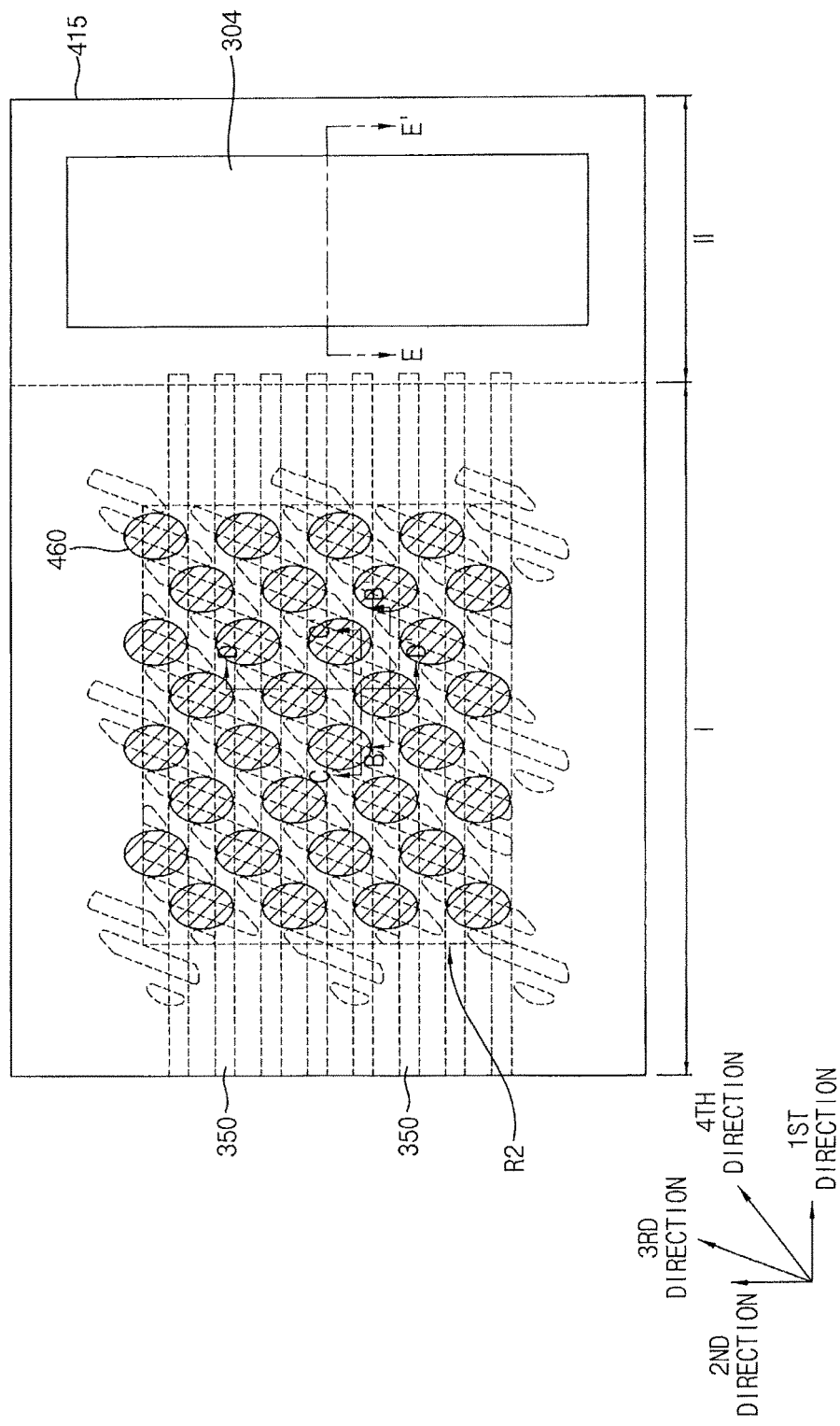
Figure 33:
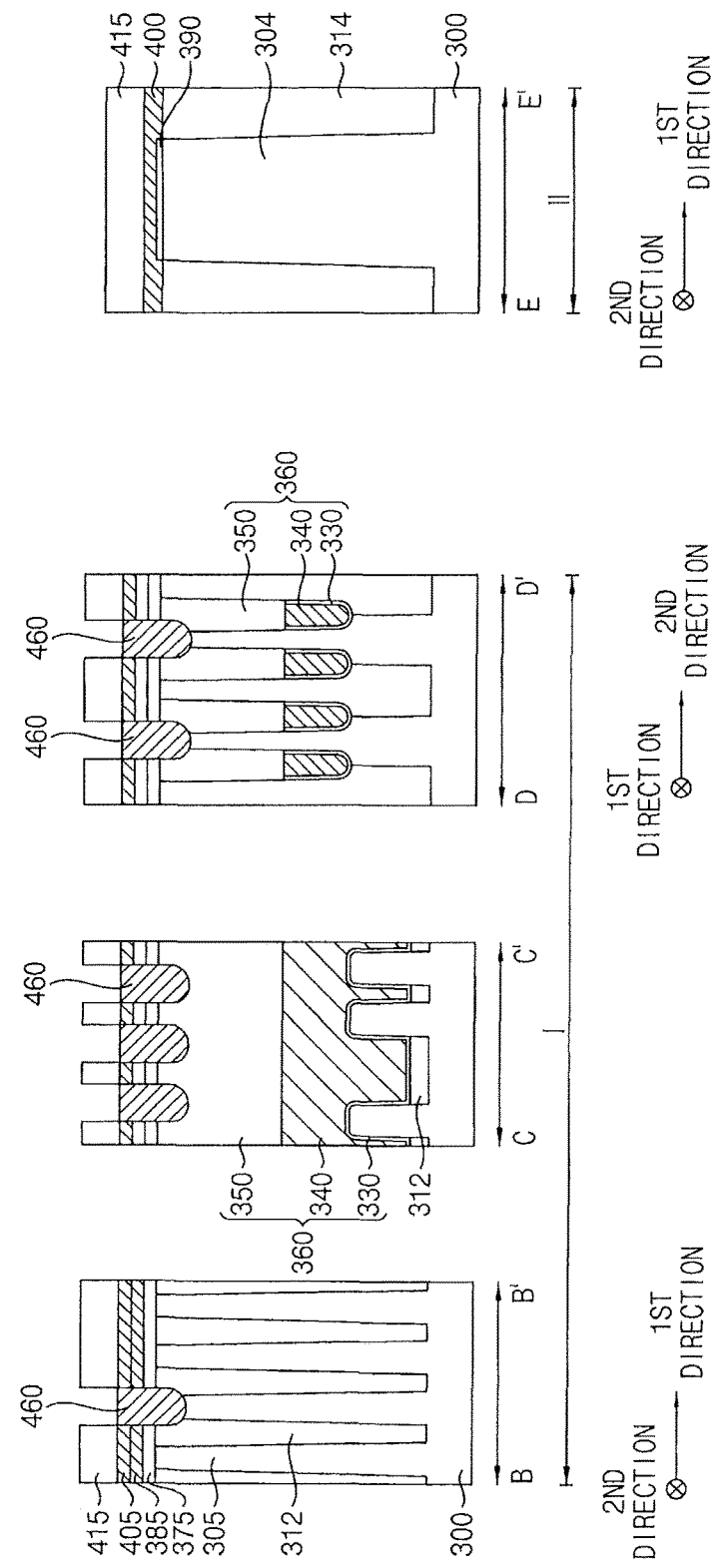

Referring to FIGS. 32 and 33, a second conductive pattern 460 may be formed to fill each of the second recesses 450. A top surface of the second conductive pattern 460 may be coplanar, or level, with a top surface of the first conductive pattern 405.

In some example embodiments, the second conductive pattern 460 may be formed by forming a second conductive layer on the first active pattern 302, the capping pattern 350, the first isolation pattern 312 and the fifth layer 415 to sufficiently fill the second recess 450, and removing an upper portion of the second conductive layer by a CMP process and/or an etch back process. Each of the second conductive patterns 460 may be formed to have a top surface substantially coplanar with a top surface of the first conductive pattern 405.

The second conductive patterns 460 may be formed both in the first and second directions to be spaced apart from each other. The second conductive layer may be formed of, for example, doped polysilicon.

Figure 34:
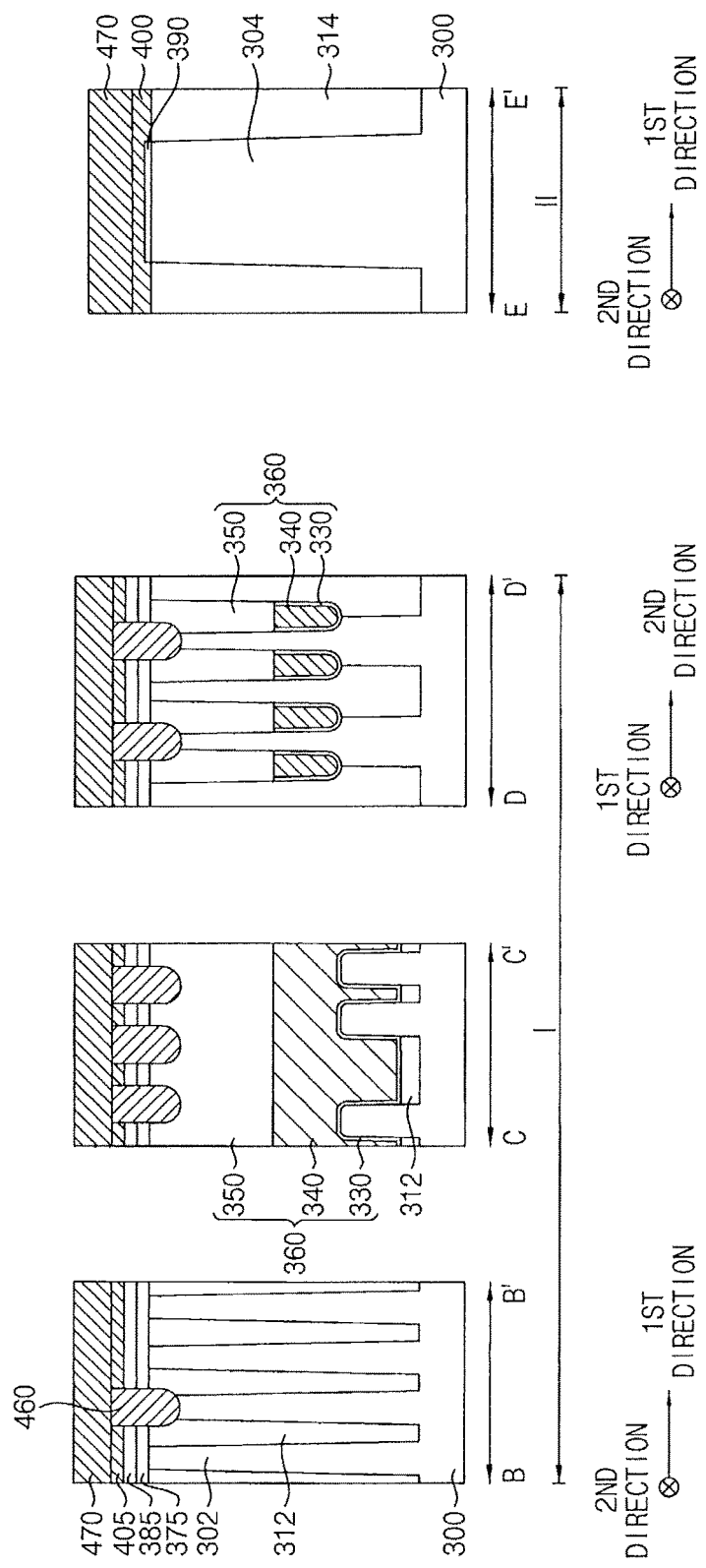

Referring to FIG. 34, the fifth layer pattern 415 may be removed. A third conductive layer 470 may be formed on the first and second conductive patterns 405 and 460 in the first region I and on the first conductive layer 400 in the second region II. The third conductive layer 470 may cover the top surface of the second conductive pattern 460.

In some example embodiments, the third conductive layer 470 may be formed of, for example, a material substantially the same as that of the first and second conductive patterns 405 and 460. That is, the third conductive layer 470 may be formed of doped polysilicon, and, thus, may be merged with the first and second conductive patterns 405 and 460.

Figure 35:
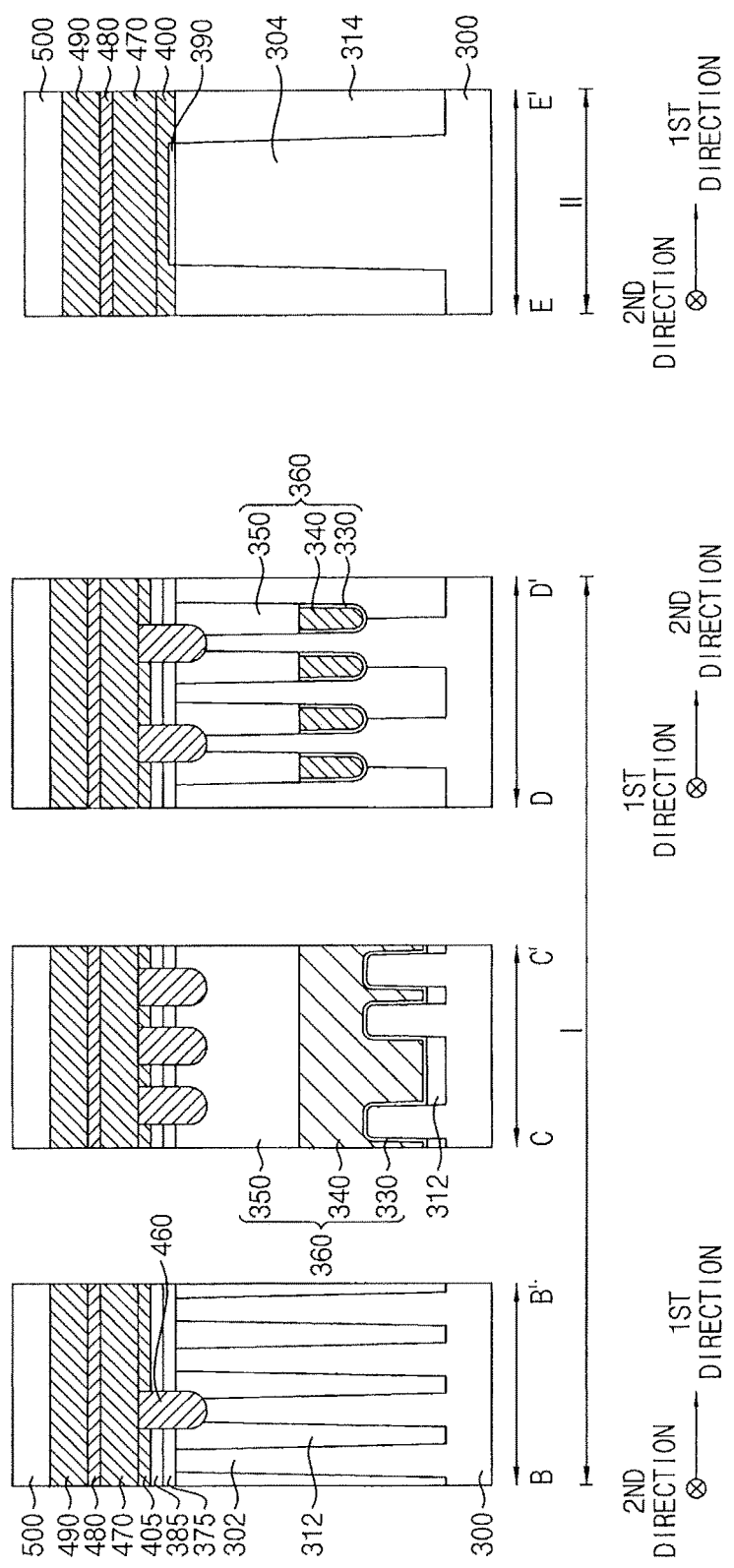

Referring to FIG. 35, a barrier layer 480, a metal layer 490 and an eighth layer 500 may be sequentially formed on the third layer 470 in the first and second regions I and II, respectively.

The barrier layer 480 may be formed of a metal, for example, titanium, tantalum, or the like, and/or a metal nitride, for example, titanium nitride, tantalum nitride, or the like. The metal layer 490 may be formed of a metal having a resistance lower than that of the first and second conductive patterns 405 and 460 and the third conductive layer 470. For example, the metal layer 490 may be formed of tungsten. The eighth layer 500 may be, for example, formed of a nitride, for example, silicon nitride.

Figure 36:
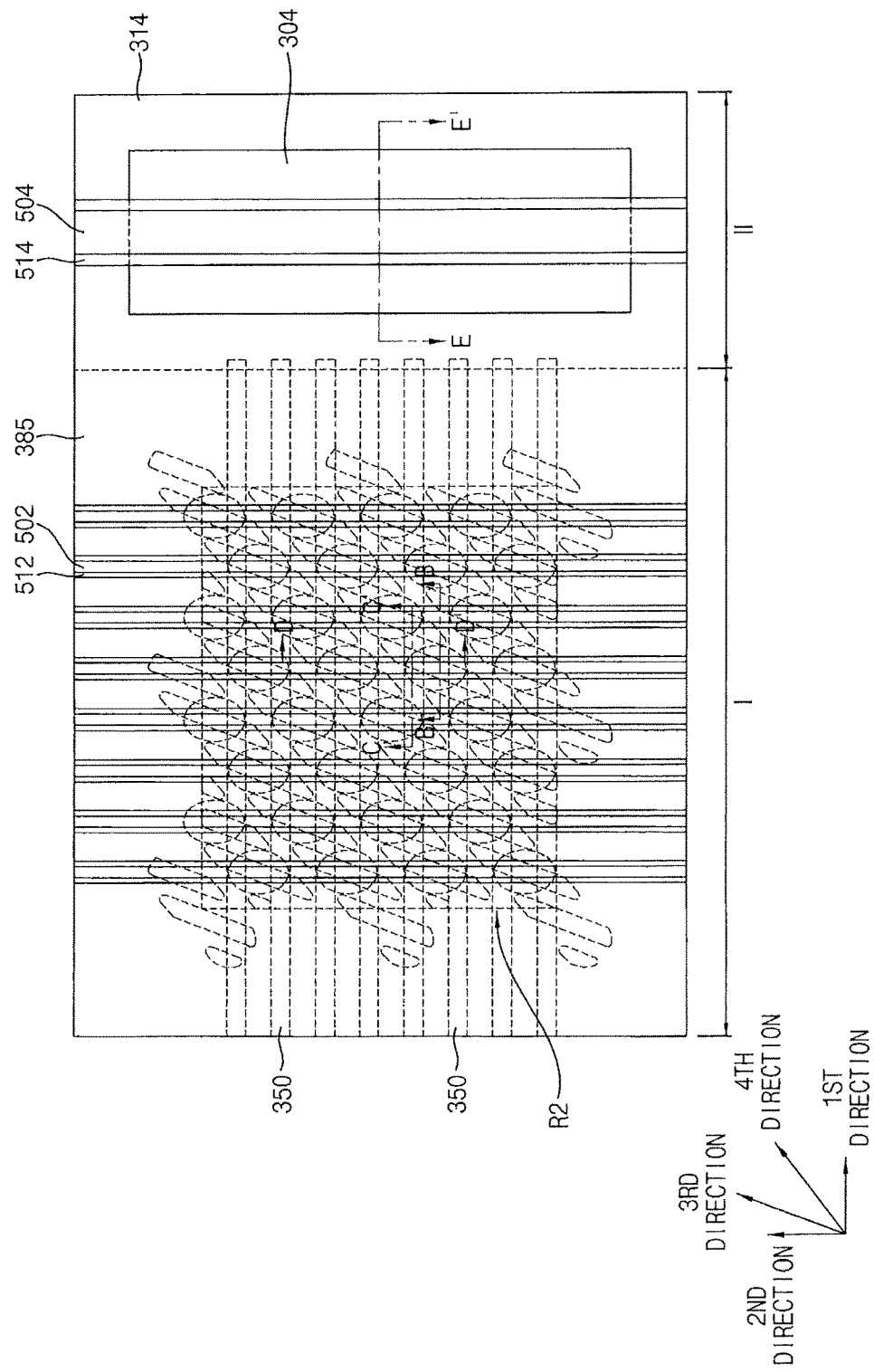
Figure 37:
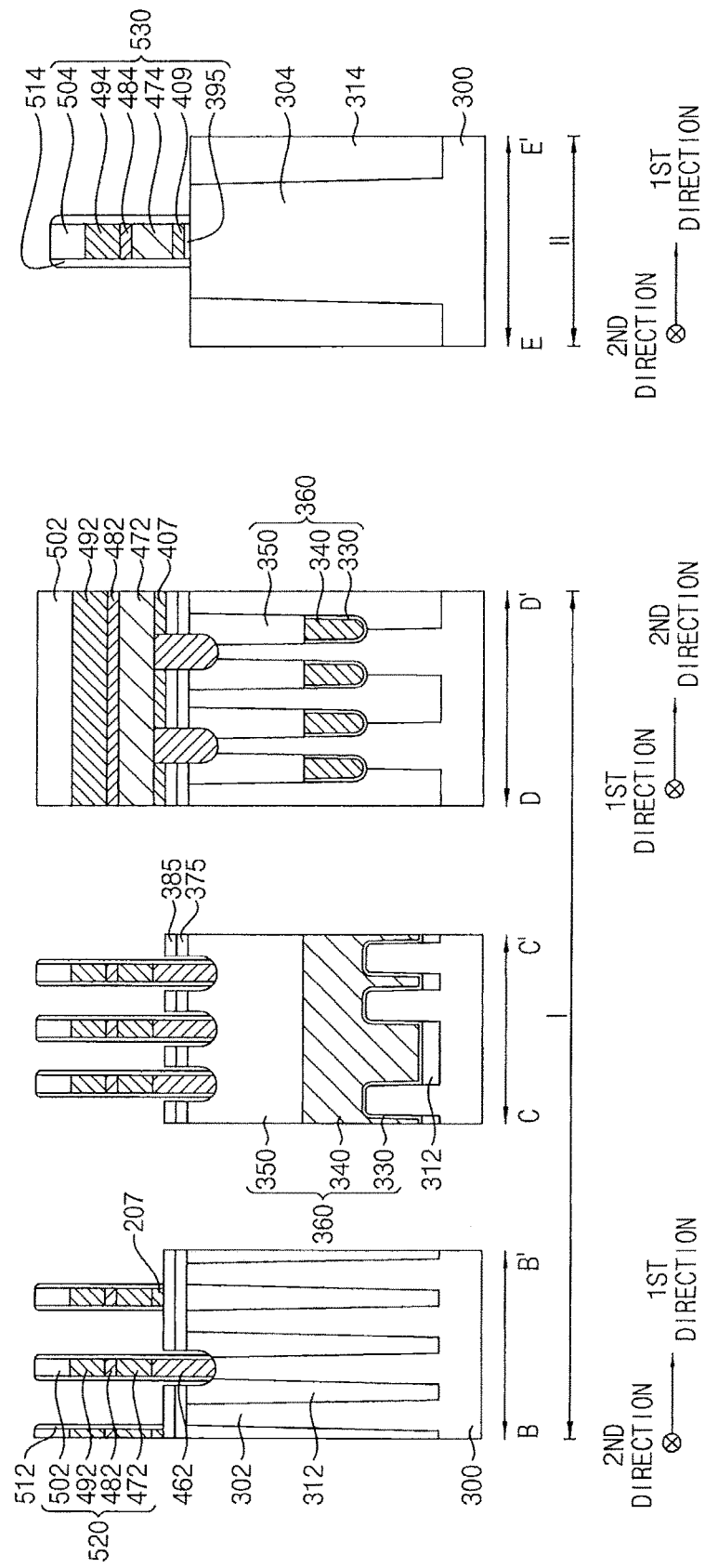

Referring to FIGS. 36 and 37, the eighth layer 500 may be etched to form first and second hard masks 502 and 504 in the first and second regions I and II, respectively, and the metal layer 490, the barrier layer 480, the third conductive layer 470, and the first and second conductive patterns 405 and 460 may be sequentially patterned using the first and second hard masks 502 and 504 as an etching mask.

Thus, a bit line structure 520 including a third conductive pattern 472, a first barrier pattern 482, a first metal pattern 492 and the first hard mask 502 sequentially stacked, and a bit line contact 462 under the bit line structure 520 may be formed in the first region I. A second gate structure 530 including a second gate insulation pattern 395, a fourth conductive pattern 409, a fifth conductive pattern 474, a second barrier pattern 484, a second metal pattern 494 and the second hard mask 504 sequentially stacked may be formed in the second region II.

In some example embodiments, as the bit line contact 462, the bit line structure 520 and the second gate structure 530 are formed, a top surface of the first etch stop pattern 385 may be partially exposed in the first region I, and top surfaces of the substrate 300 and the second isolation pattern 314 may be partially exposed in the second region II. In some example embodiments, since the third conductive layer 470 may be formed of a material substantially the same as that of the first and second conductive patterns 405 and 460, the bit line contact 462 and the third conductive pattern 472 may be merged with each other in the first region I, and the fourth and fifth conductive patterns 409 and 474 may be merged with each other in the second region II.

The bit line contact 462 may partially fill each of the second recesses 450, and a plurality of bit line contacts 462 may be formed both in the first and second directions to be spaced apart from each other. As the bit line contact 462, the bit line structure 520 and the second gate structure 530 are formed, sidewalls of the second recesses 450 may be partially exposed. The bit line structure 520 may extend in the second direction, and a plurality of bit line structures 520 may be formed in the first direction. The second gate structure 530 may extend in the second direction.

A first spacer 512 may be formed on a sidewall of each of the bit line contact 462 and the bit line structure 520 in the first region I, and a second spacer 514 may be formed on a sidewall of the second gate structure 530 in the second region II. After forming the first spacers 512, a portion of the sidewalls of the second recesses 450 may remain exposed.

In some example embodiments, the first and second spacers 512 and 514 may be formed by, for example, forming a first spacer layer covering the bit line contact 462 and the bit line structure 520 in the first region I and a second spacer layer covering the second gate structure 530 in the second region II, and anisotropically etching the first and second spacer layers. Thus, the first spacer 512 may extend in the second direction, and a plurality of first spacers 512 may be formed in the first direction. The second spacer 514 may extend in the second direction. The first and second spacer layers may be formed of an insulation material, for example, silicon oxide and/or silicon nitride.

After forming the second spacer 514, an ion implantation process may be performed on the second active pattern 304 in the second region II to form a second impurity region (not shown) at an upper portion of the second active pattern 304 adjacent the second gate structure 530. The second gate structure 530 and the second impurity region may form a transistor.

Figure 38:
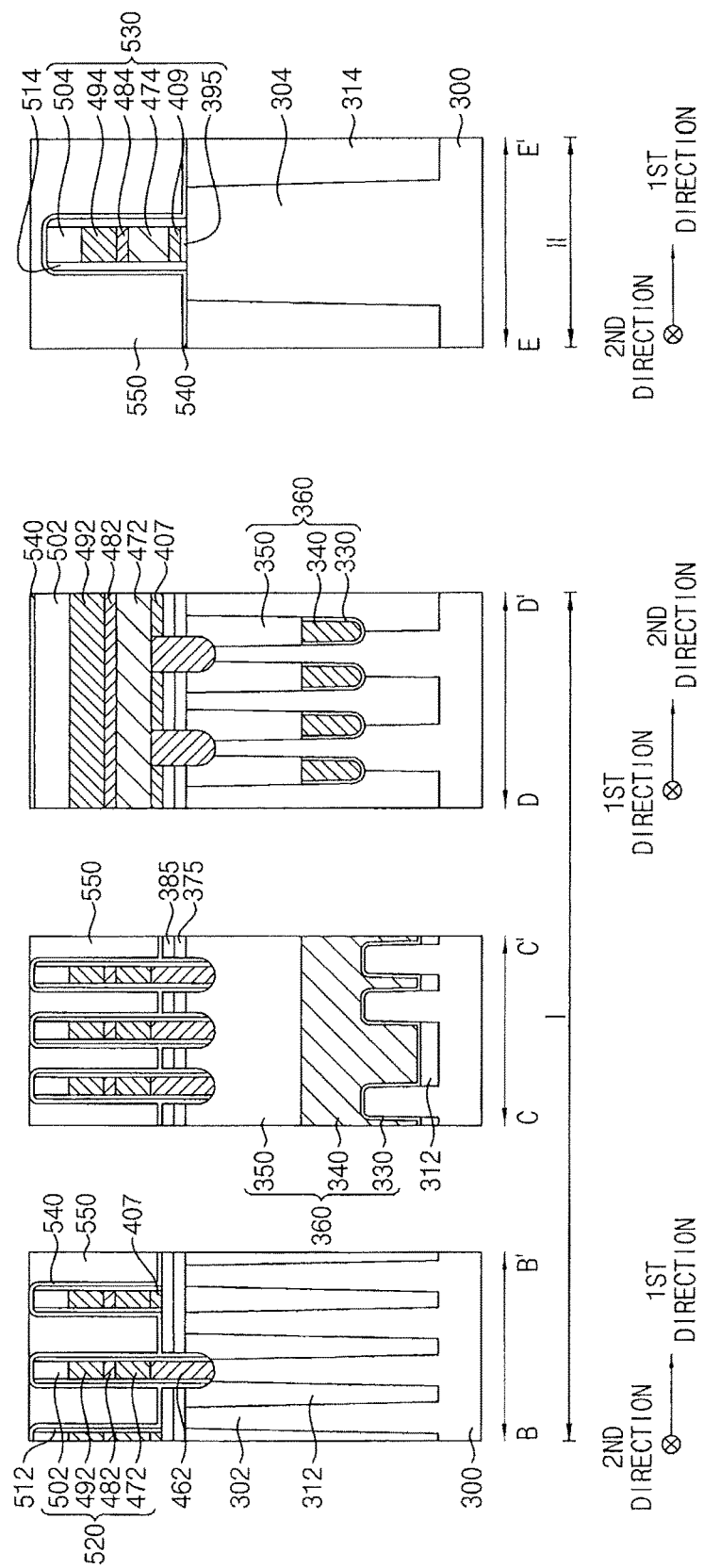

Referring to FIG. 38, a second etch stop layer 540 may be formed on the first etch stop pattern 385, the first spacers 512 and the exposed upper surfaces of the first hard masks 502 in the first region I and the second active pattern 304, the second spacer 514 and the exposed upper surfaces of the second hard mask 504 in the second region II thereby covering the bit line contact 462 and the bit line structure 520 in the first region I and the second gate structure 530 in the second region II. The second etch stop layer 540 may also be formed on an upper sidewall of each of the second recesses 450 that may be exposed as the second conductive pattern 460 is partially removed during the formation of the bit line contact 462. Thus, the second etch stop layer 540 may fill a remaining portion of the second recess 450. The second etch stop layer 540 may include, for example, silicon nitride.

A first insulating interlayer may be formed on the second etch stop layer 540 in the first and second regions I and II to cover the bit line structure 520 and the second gate structure 530. An upper portion of the first insulating interlayer in the first and second regions I and II may be planarized until a top surface of the second etch stop layer 540 may be exposed thereby forming a first insulating interlayer pattern 550. Thus, the first insulating interlayer pattern 550 may be formed between neighboring ones of the bit line structures 520 in the first region I, and may extend in the second direction. A plurality of first insulating interlayer patterns 550 may be formed in the first direction. The first insulating interlayer pattern 550 may cover the second gate structure 530 in the second region II. The first insulating interlayer may be formed of an oxide, for example, silicon oxide.

Figure 39:
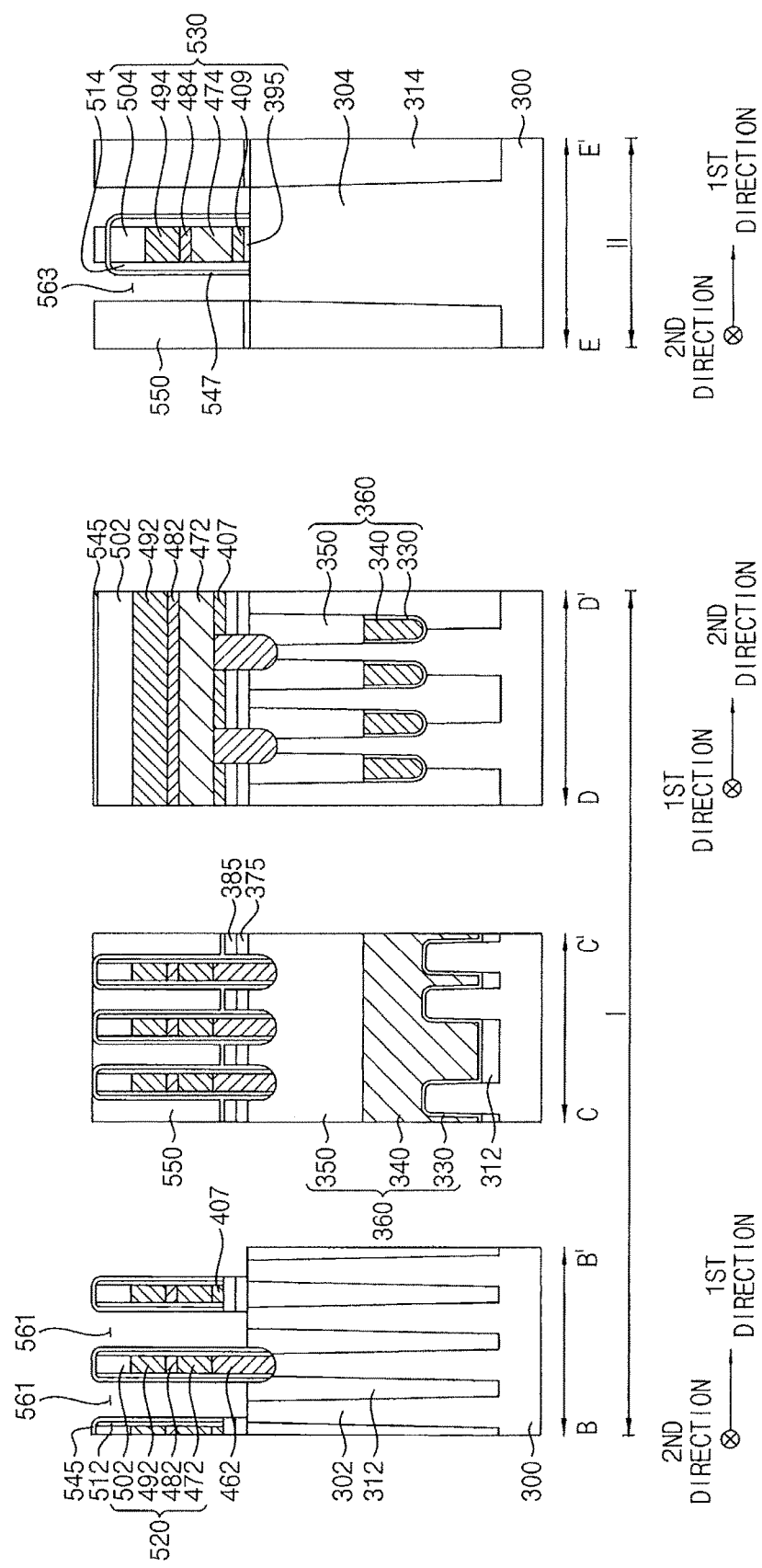

Referring to FIG. 39, the first insulating interlayer pattern 550, the second etch stop layer 540, the first etch stop pattern 385 and the pad pattern 375 in the first region I may be partially etched, and the first insulating interlayer pattern 550 and the second etch stop layer 540 in the second region II may be partially etched thereby forming first and second openings 561 and 563. The first and second openings 561 and 563 may partially expose top surfaces of the first and second active patterns 302 and 304 in the first and second regions I and II, respectively. Thus, the first and second openings 561 and 563 may partially expose the first and second impurity regions, respectively, at the upper portions of the substrate 300.

In some example embodiments, a plurality of first openings 561 may be formed in the second direction between neighboring ones of the bit line structures 520 in the first direction. Each of the first openings 561 may be formed to be self-aligned with the bit line structure 520 and the bit line contact 462, and two first openings 561 may be formed in each of the first active patterns 302 in the first region I.

In some example embodiments, a plurality of second openings 563 may be formed in the first direction.

Due to the partial etching of the second etch stop layer 540, the second etch stop layer 540 may be transformed into second and third etch stop patterns 545 and 547 in the first and second regions I and II, respectively. The second etch stop pattern 545 may cover the bit line structure 520 in the first region I, and may extend in the second direction. A plurality of second etch stop patterns 545 may be formed in the first direction. The third etch stop pattern 547 may cover the second gate structure 530 in the second region II, and may extend in the second direction. A portion of the first insulating interlayer pattern 550 may remain on an upper portion of third etch stop pattern 547.

Figure 40:
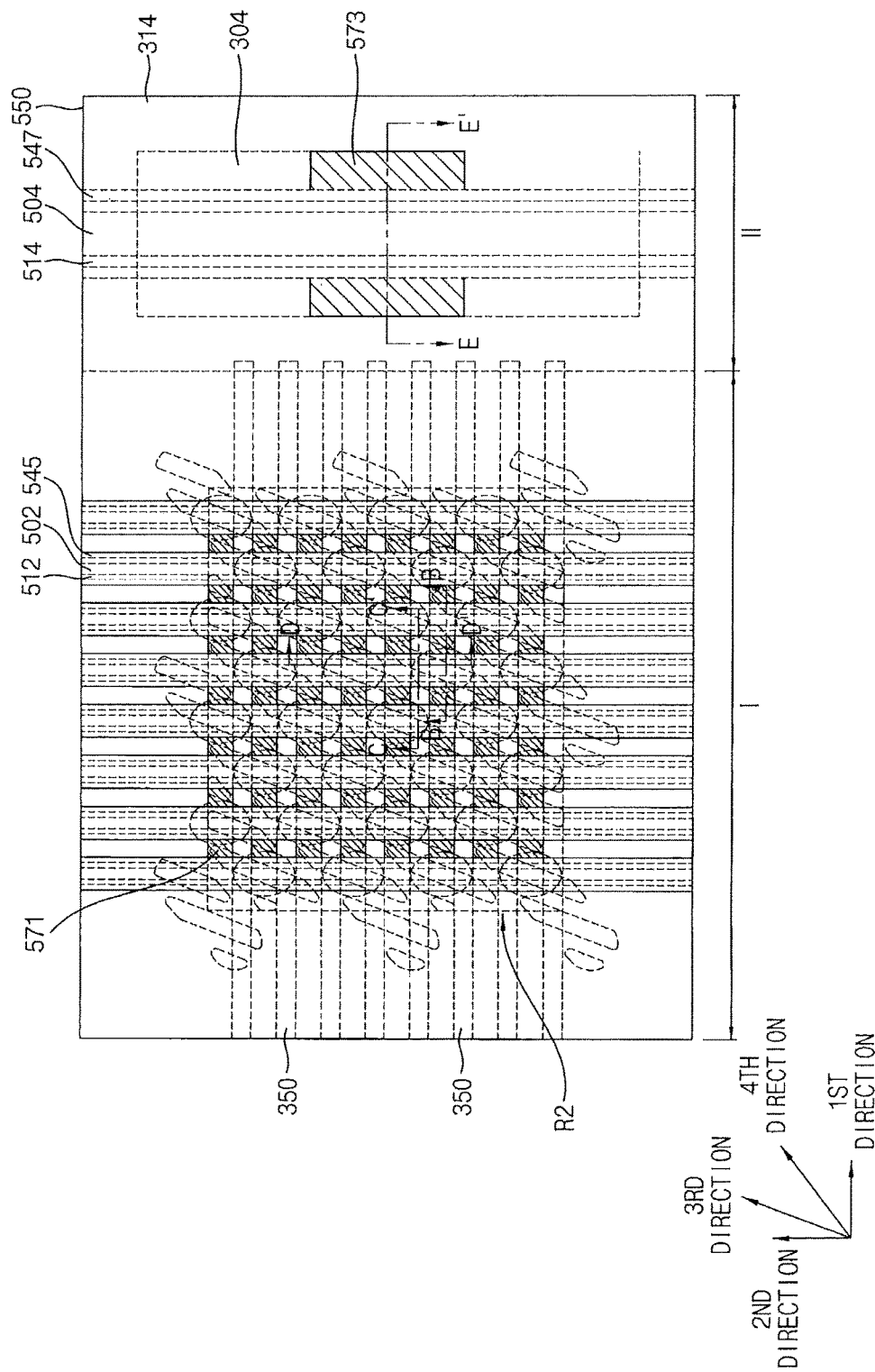
Figure 41:
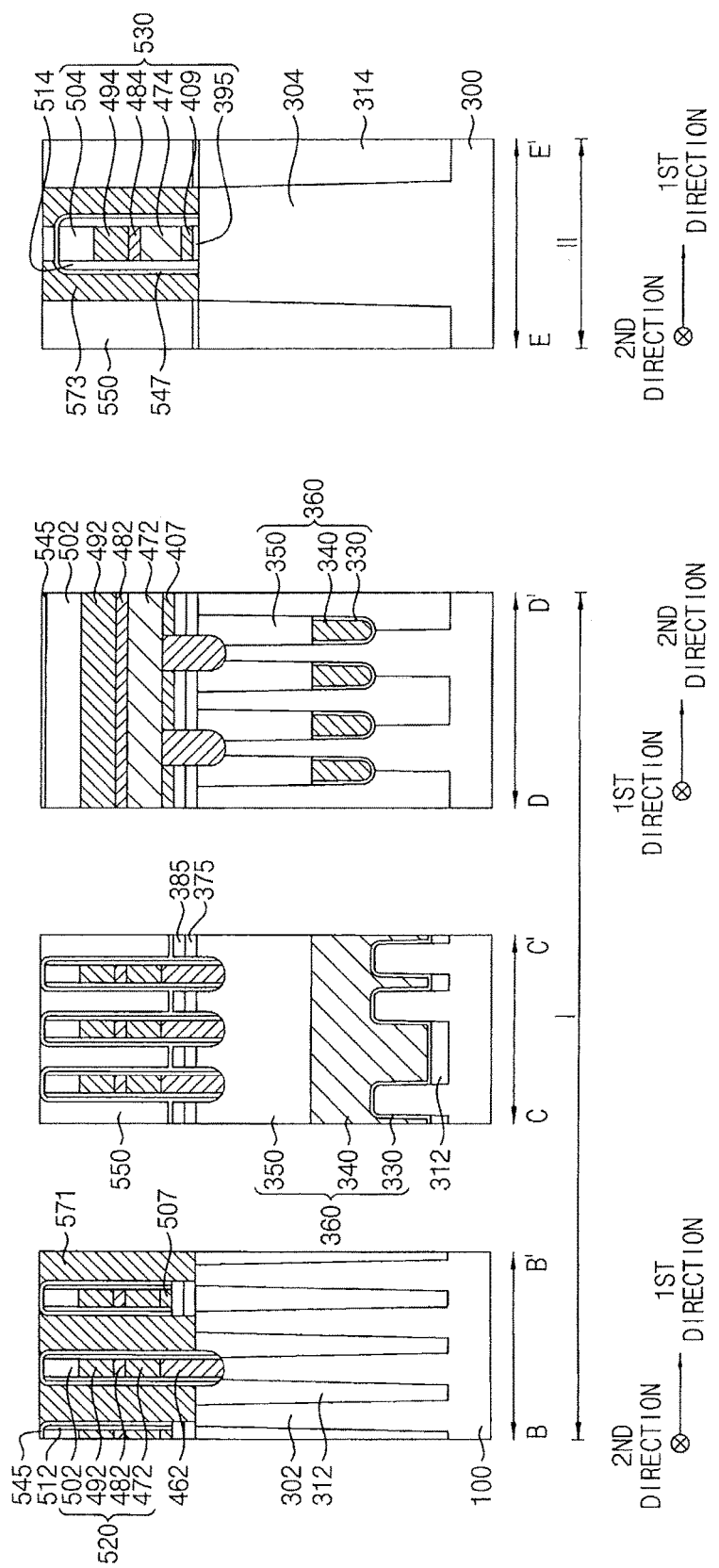

Referring to FIGS. 40 and 41, a capacitor contact 571 filling the first opening 561 may be formed in the first region I and a contact plug 573 filling the second opening 563 may be formed in the second region II.

The capacitor contact 571 may be formed by forming a conductive layer on the exposed first active pattern 302, the second etch stop pattern 545 and the first insulating interlayer pattern 550 in the first region I to sufficiently fill the first opening 561, and planarizing an upper portion of the conductive layer until a top surface of the second etch stop pattern 545 may be exposed. That is, a top surface of the capacitor contact 571 may be coplanar, or level, with a top surface of the second etch stop pattern 545. Thus, the capacitor contact 571 may be formed on the first active pattern 302 in the first region I to contact a top surface of the first impurity region.

The contact plug 573 may be formed by forming a conductive layer on the second active pattern 304, the first insulating interlayer pattern 550 and the third etch stop pattern 547 in the second region II to sufficiently fill the second opening 563, and planarizing an upper portion of the conductive layer until a top surface of the third etch stop pattern 547 may be exposed. Thus, the contact plug 573 may be formed on the second active pattern 304 in the second region II to contact a top surface of the second impurity region. A top surface of the contact plug 573 may be coplanar, or level, with a top surface of first insulating interlayer pattern 550.

The conductive layer may be formed of a metal, for example, tungsten, aluminum, copper, or the like, and/or doped polysilicon.

Alternatively, the capacitor contact 571 and the contact plug 573 may be simultaneously formed.

Figure 42:
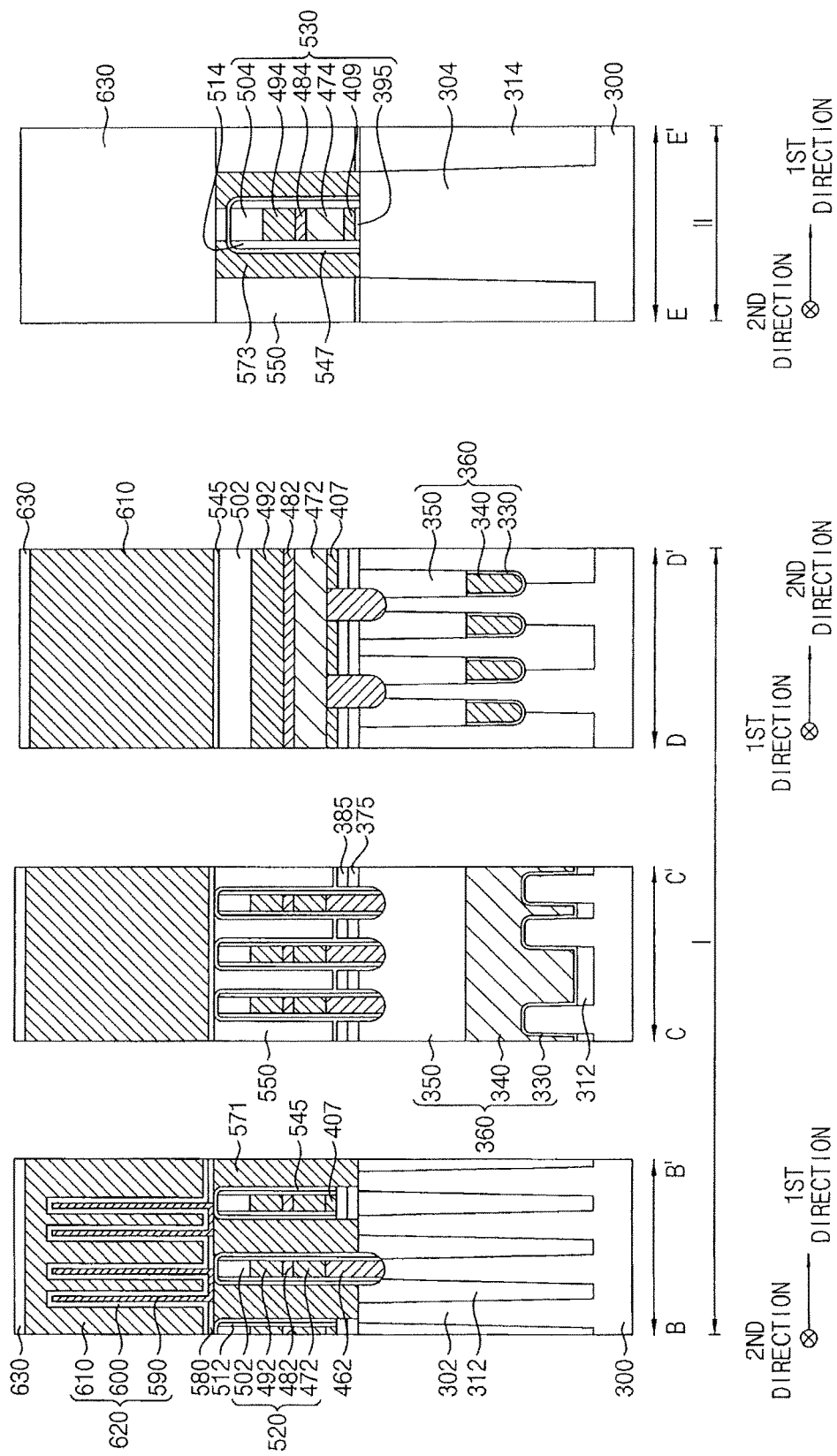

Referring to FIG. 42, a capacitor 620 may be formed to contact a top surface of the capacitor contact 571 in the first region I.

Particularly, a fourth etch stop layer 580 and a mold layer (not shown) may be sequentially formed on the second etch stop pattern 545 and the capacitor contact 571 in the first region I, and may be partially etched to form a contact hole (not shown) partially exposing a top surface of the capacitor contact 571. A portion of a top surface of the second etch stop pattern 545 may be exposed.

A lower electrode layer (not shown) may be formed on a sidewall of the contact hole, the exposed top surface of the capacitor contact 571 and the mold layer. A sacrificial layer (not shown) may be formed on the lower electrode layer to sufficiently fill a remaining portion of the contact hole, upper portions of the lower electrode layer and the sacrificial layer may be planarized until a top surface of the mold layer may be exposed to divide the lower electrode layer. The remaining sacrificial layer and the mold layer may be removed by, for example, a wet etching process, and thus a cylindrical lower electrode 590 may be formed on the exposed top surface of the capacitor contact 571. Alternatively, a pillar-type lower electrode 590 filling the contact hole may be formed.

A dielectric layer 600 may be formed on the lower electrode 590 and the fourth etch stop layer 580, and an upper electrode 610 may be formed on the dielectric layer 600 thereby forming a capacitor 620 including the lower electrode 590, the dielectric layer 600 and the upper electrode 610.

In some example embodiments, the lower electrode 590 and the upper electrode 610 may be formed of substantially the same material, for example, doped polysilicon or a metal. The dielectric layer 600 may be formed of an oxide, for example, silicon oxide, metal oxide, or the like, and/or a nitride, for example, silicon nitride, metal nitride, or the like. The metal of the dielectric layer 600 may include, for example, aluminum, zirconium, titanium, hafnium, or the like.

A second insulating interlayer 630 may be formed in the first and second regions I and II to cover the capacitor 620 in the first region I, which may complete the semiconductor device.

The foregoing is illustrative of example embodiments of the present inventive concepts and is not to be construed as limiting thereof. Although a few example embodiments have been described, those skilled in the art will readily appreciate that many modifications are possible in the example embodiments without materially departing from the novel teachings and advantages of the present inventive concepts. Accordingly, all such modifications are intended to be included within the scope of the present inventive concepts as defined in the claims. In the claims, means-plus-function clauses are intended to cover the structures described herein as performing the recited function and not only structural equivalents but also equivalent structures. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A method of forming active patterns, the method comprising:
    forming a plurality of first patterns in a first direction on a cell region of a substrate and a second pattern on a peripheral circuit region of the substrate, each of the first patterns extending in a third direction crossing the first direction;
    forming a plurality of first masks in the first direction on the first patterns and a second mask on the second pattern, each of the first masks extending in a fourth direction crossing the third direction;
    forming a plurality of third masks between the first masks, each of the third masks extending in the fourth direction;
    etching the first patterns using the first and third masks as an etching mask and the second pattern using the second mask as an etching mask to form third and fourth patterns, respectively; and
    etching upper portions of the substrate using the third and fourth patterns as an etching mask to form first and second active patterns in the cell region and the peripheral circuit region, respectively.

2. The method of claim 1, further comprising, prior to forming the first and second masks, forming an intermediate layer covering the first and second patterns,
    wherein the first and second masks are formed on the intermediate layer.

3. The method of claim 2, wherein forming the plurality of third masks between the first masks includes:
    forming a spacer layer on the intermediate layer to cover the first masks;
    forming a third mask layer on the intermediate layer; and
    planarizing an upper portion of the third mask layer to form the plurality of third masks.

4. The method of claim 3, wherein the spacer layer is formed to cover the second mask,
    and the method further comprises, after forming the third mask layer:
    forming a fourth mask on the third mask layer on a portion of the cell region; and
    etching the third mask layer using the fourth mask as an etching mask to remove a portion of the third mask layer on the peripheral circuit region of the substrate.

5. The method of claim 4, wherein etching the third mask layer using the fourth mask as an etching mask includes forming a third mask layer pattern partially covering the cell region,
    and wherein the third masks are formed by planarizing an upper portion of the third mask layer pattern.

6. The method of claim 4, wherein the fourth mask has a rectangular shape in a plan view.

7. The method of claim 6, wherein the fourth mask overlaps a central portion of each of the first masks, and ends of each of the first masks extend beyond the fourth mask in the fourth direction.

8. The method of claim 7, wherein a length of each of the third masks in the fourth direction is less than a length of each of the first masks in the fourth direction.

9. The method of claim 4, further comprising, prior to forming the fourth mask on the third mask layer:
   forming a protection layer on the third mask layer; and
   etching the protection layer using the fourth mask as an etching mask to form a protection pattern exposing a portion of the third mask layer on the peripheral circuit region of the substrate.

10. The method of claim 1, wherein the first and third masks are spaced apart from each other in the first direction by a constant distance.

11. The method of claim 1, wherein forming the first and second patterns in the cell region and the peripheral circuit region, respectively, of the substrate includes:
   forming a layer structure on the substrate; and
   forming a plurality of openings in the first direction through the layer structure in the cell region to expose top surfaces of the substrate, respectively, each of the openings extending in the third direction.

12. The method of claim 1, wherein the first, third and fourth directions have acute angles with one another.

13. The method of claim 1, wherein the second mask extends in a second direction substantially perpendicular to the first direction.

14. The method of claim 1, wherein a whole contour of the first patterns is a first rectangular shape, and wherein a whole contour of the first active patterns is a second rectangular shape smaller than and within the first rectangular shape in a plan view, and a portion of the contour of the first active patterns protrudes from the second rectangular shape.

15. A method of forming active patterns, the method comprising:
   forming a plurality of first patterns in a first direction on a cell region of a substrate and a second pattern on a peripheral circuit region of the substrate, each of the first patterns extending in a third direction crossing the first direction;
   forming a plurality of first masks in the first direction on the first patterns and a second mask on the second pattern, each of the first masks extending in a fourth direction crossing the third direction;
   etching the first patterns using the first masks as an etching mask and the second pattern using the second mask as an etching mask to form third and fourth patterns, respectively; and
   etching upper portions of the substrate using the third and fourth patterns as an etching mask to form first and second active patterns in the cell region and the peripheral circuit region, respectively, the first active patterns being spaced apart from each other by a constant distance in the third direction and defining a first active pattern columns and the first active pattern columns being spaced apart from each other by a constant distance in the first direction.

16. The method of claim 15, wherein forming the plurality of first masks further comprises forming a plurality of third masks between the first masks, each of the third masks extending in the fourth direction and wherein etching the first patterns comprises using the first and third masks as an etching mask.

17. The method of claim 16, wherein the first and third masks are spaced apart from each other in the first direction by a constant distance.

18. The method of claim 15, wherein the first, third and fourth directions have acute angles with one another.

19. The method of claim 15, wherein the second mask extends in a second direction substantially perpendicular to the first direction.

20. A method of manufacturing a semiconductor device, the method comprising:
   forming a plurality of first patterns in a first direction on a cell region of a substrate and a second pattern on a peripheral circuit region of the substrate, each of the first patterns extending in a third direction crossing the first direction;
   forming a plurality of first masks in the first direction on the first patterns and a second mask on the second pattern, each of the first masks extending in a fourth direction crossing the third direction;
   forming a plurality of third masks between the first masks, each of the third masks extending in the fourth direction;
   etching the first patterns using the first and third masks as an etching mask and the second patterns using the second mask as an etching mask to form third and fourth patterns, respectively;
   etching upper portions of the substrate using the third and fourth patterns as an etching mask to form first and second active patterns in the cell region and the peripheral circuit region, respectively;
   forming a first gate structure through the first active patterns;
   forming first and second impurity regions at upper portions of the first active patterns adjacent the first gate structure;
   forming a bit line electrically connected to the first impurity region; and
   forming a capacitor electrically connected to the second impurity region.

* * * * *